(12) United States Patent
Rachmady et al.

(10) Patent No.: US 12,288,803 B2
(45) Date of Patent: *Apr. 29, 2025

(54) TRANSISTOR WITH ISOLATION BELOW SOURCE AND DRAIN

(71) Applicant: Intel Corporation, Santa Clara, CA (US)

(72) Inventors: Willy Rachmady, Beaverton, OR (US); Cheng-Ying Huang, Portland, OR (US); Matthew V. Metz, Portland, OR (US); Nicholas G. Minutillo, Beaverton, OR (US); Sean T. Ma, Portland, OR (US); Anand S. Murthy, Portland, OR (US); Jack T. Kavalieros, Portland, OR (US); Tahir Ghani, Portland, OR (US); Gilbert Dewey, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/540,544

(22) Filed: Dec. 14, 2023

(65) Prior Publication Data

US 2024/0113161 A1 Apr. 4, 2024

Related U.S. Application Data

(63) Continuation of application No. 17/493,695, filed on Oct. 4, 2021, now Pat. No. 11,923,410, which is a
(Continued)

(51) Int. Cl.
*H01L 29/06* (2006.01)
*H01L 29/205* (2006.01)
(Continued)

(52) U.S. Cl.
CPC ...... *H01L 29/0653* (2013.01); *H01L 29/0673* (2013.01); *H01L 29/205* (2013.01); *H01L 29/42392* (2013.01); *H01L 29/785* (2013.01)

(58) Field of Classification Search
CPC ............. H01L 29/0653; H01L 29/0673; H01L 29/0847; H01L 29/1037; H01L 29/205;
(Continued)

(56) References Cited

U.S. PATENT DOCUMENTS 9,455,317 B1 * 9/2016 Basker ................ H01L 29/0649
9,704,863 B1 7/2017 Cheng
(Continued)

FOREIGN PATENT DOCUMENTS

KR 1020160101213 8/2016
WO WO 2013/101230 7/2013
(Continued)

OTHER PUBLICATIONS

International Search Report and Written Opinion received for PCT Application No. PCT/US2017/067500 mailed Sep. 19, 2018, 15 pages.
(Continued)

*Primary Examiner* — Changhyun Yi
(74) *Attorney, Agent, or Firm* — Schwabe, Williamson & Wyatt P.C.

(57) ABSTRACT

A transistor includes a body of semiconductor material, where the body has laterally opposed body sidewalls and a top surface. A gate structure contacts the top surface of the body. A source region contacts a first one of the laterally opposed body sidewalls and a drain region contacts a second one of the laterally opposed body sidewalls. A first isolation region is under the source region and has a top surface in contact with a bottom surface of the source region. A second isolation region is under the drain region and has a top
(Continued)

surface in contact with a bottom surface of the drain region. Depending on the transistor configuration, a major portion of the inner-facing sidewalls of the first and second isolation regions contact respective sidewalls of either a subfin structure (e.g., FinFET transistor configurations) or a lower portion of a gate structure (e.g., gate-all-around transistor configuration).

20 Claims, 5 Drawing Sheets

Related U.S. Application Data continuation of application No. 16/647,695, filed as application No. PCT/US2017/067500 on Dec. 20, 2017, now Pat. No. 11,171,207.

(51) Int. Cl.
*H01L 29/423* (2006.01)
*H01L 29/78* (2006.01)

(58) Field of Classification Search
CPC . H01L 29/42392; H01L 29/785; H01L 29/20; H01L 29/66545; H01L 29/66795
See application file for complete search history.

(56) References Cited

U.S. PATENT DOCUMENTS

| | | |
|---|---|---|
| 9,847,391 B1 | 12/2017 | Zang |
| 11,923,410 B2* | 3/2024 | Rachmady .......... H01L 29/0847 |
| 2005/0224800 A1 | 10/2005 | Lindert |
| 2005/0227424 A1 | 10/2005 | Oh |
| 2009/0008705 A1 | 1/2009 | Zhu |
| 2012/0091528 A1 | 4/2012 | Chang |
| 2014/0203327 A1 | 7/2014 | Pillarisetty |
| 2014/0225065 A1* | 8/2014 | Rachmady ............ H01L 29/775 |
| | | 438/283 |
| 2015/0035018 A1 | 2/2015 | Liu |
| 2015/0221726 A1 | 8/2015 | Wong et al. |
| 2015/0311207 A1 | 10/2015 | Ching |
| 2015/0318399 A1 | 11/2015 | Jeong |
| 2016/0276436 A1 | 9/2016 | Pan |
| 2016/0315149 A1 | 10/2016 | Cheng et al. |

FOREIGN PATENT DOCUMENTS

| | | |
|---|---|---|
| WO | WO 2017052601 | 3/2017 |
| WO | WO 2019125424 | 6/2019 |

OTHER PUBLICATIONS

International Preliminary Report on Patentability, PCT Application No. PCT/US2017/067500 mailed Jul. 2, 2020, 12 pages.
Search Report from European Patent Application No. 17935476.6 mailed Jun. 8, 2021, 7 pages.

\* cited by examiner

TRANSISTOR WITH ISOLATION BELOW SOURCE AND DRAIN

CROSS-REFERENCE TO RELATED APPLICATION

This patent application is a continuation of U.S. patent application Ser. No. 17/493,695, filed Oct. 4, 2021, which is a continuation of U.S. patent application Ser. No. 16/647,695, filed Mar. 16, 2020, now U.S. Pat. No. 11,171,207, issued Nov. 9, 2021, which is a U.S. National Phase Application under 35 U.S.C. § 371 of International Application No. PCT/US2017/067500, filed Dec. 20, 2017, entitled "TRANSISTOR WITH ISOLATION BELOW SOURCE AND DRAIN," which designates the United States of America, the entire disclosure of which are hereby incorporated by reference in their entirety and for all purposes.

BACKGROUND

Semiconductor devices are electronic components that exploit the electronic properties of semiconductor materials, such as silicon (Si), germanium (Ge), gallium arsenide (GaAs), and indium phosphide (InP), to name a few examples. A field effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal that can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material generally referred to as a fin. Because the conductive channel of such configurations includes three different planer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region with the gate on two or three portions, the gate material generally surrounds or encircles each nanowire of the channel region, hence a "gate-all-around" structure.

Figure 1A:
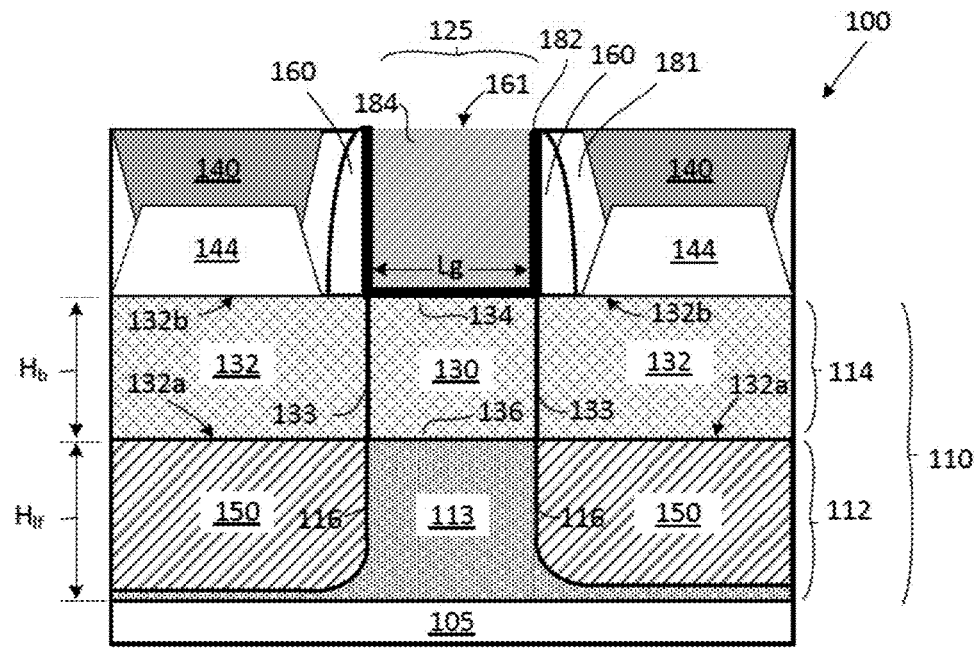
FIG. 1A illustrates a cross-sectional view taken parallel to and through the semiconductor fin structure of a transistor having a tri-gate configuration, wherein insulator material is below the source and drain regions and extends upward along the lower portion (sub-channel) of the fin structure to the bottom surface of the upper portion (channel region) of the fin structure, in accordance with some embodiments of the present disclosure.

These and other features of the present embodiments will be understood better by the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually distinguishing the different features. In short, the figures are provided merely to show example structures.

DETAILED DESCRIPTION

Non-planar transistor structures are disclosed that include an isolation region of insulator material below the source and drain regions. Such a structure can be used in various transistor structures, including metal-oxide semiconductor field effect transistor (MOSFET) devices, for example. In some embodiments, a transistor includes a body of semiconductor material that comprises the channel region of the transistor, wherein the body has a fin-like structure including laterally opposed body sidewalls and a top surface, or a wire-like structure that further includes a bottom surface. In some embodiments, a gate structure contacts the top surface and opposing sidewalls of the channel region to provide double-gate and tri-gate transistor configurations, while in other embodiments the gate structure is on all sides of or otherwise all around the channel region to provide gate-all-around transistor configurations. A source region contacts a first side of the channel region and a drain region contacts a second side of the channel region. A first isolation region is under the source region and has a top surface in contact with a bottom surface of the source region. A second isolation region is under the drain region and has a top surface in contact with a bottom surface of the drain region. As will be appreciated in light of this disclosure, the disclosed methodologies enable high performance transistor devices while reducing or eliminating parasitic subfin leakage.

General Overview

In some instances, a FinFET device can exhibit parasitic leakage between the source and drain regions. For example, charge carriers tunnel through the material of the lower fin portion and bypass the channel region. Controlling parasitic leakage is a significant challenge in scaling III-V transistors. Unlike silicon transistors, doping via implant is not an option since the dopants used in III-V materials diffuse quickly. One approach to reducing parasitic subfin leakage is to use a gate-all-around (GAA) structure, where the gate structure contacts the sides, the top, and the bottom of the channel region. For example, the bottom portion of the gate structure is located below the channel region in place of the material of the lower fin portion. As such, the bottom portion of the gate structure replaces the lower fin material where the parasitic subfin leakage occurred and provides a barrier to parasitic leakage. In some cases, the bottom portion of the gate structure has a width that extends laterally beyond the channel region, resulting in variation in the gate length Lg. To avoid this variation in gate length Lg, the bottom portion of the gate can be formed having the same width as the top portion and including insulating spacers along sides of the bottom portion of the gate in a position similar to the spacers along the upper portion of the gate. However, integrating spacers into the lower gate structure is complex and challenging. Therefore, to improve the performance of a FET with a group III-V material, it would be desirable to further reduce or eliminate parasitic subfin leakage.

Thus, and in accordance with some embodiments of the present disclosure, techniques are provided for forming tri-gate and GAA transistor structures that include an isolation structure below the source and drain regions. In some embodiments, a gate structure including the gate dielectric and gate electrode is formed on the top and opposing sidewalls of the semiconductor body or so-called fin between the source and drain regions, resulting in a tri-gate structure. In other embodiments, in addition to contacting the top and opposing sidewalls of the semiconductor body, the gate structure also contacts a bottom surface of the semiconductor body or so-called nanowire (or nanoribbon), resulting in a gate-all-around structure. In any such cases, an insulating structure provisioned below the source and drain regions reduces or blocks parasitic leakage from the source and drain regions since the insulating structure extends along and contacts the bottom surface of the source and drain regions. In some embodiments, the fin structure comprising the channel region may be, for instance, a group III-V semiconductor material, or a multilayer structure comprising two distinct group III-V semiconductor materials. For instance, in some example embodiments, the fin structure includes a top portion that includes the channel region and a bottom portion that includes the sub-channel (sometimes called subfin) region, wherein the top portion is compositionally different from the bottom portion, such as a bottom portion of gallium arsenide and a top portion of indium gallium arsenide. In such a case, the isolation structures below the source and drain regions extend up the sidewalls of the bottom portion and the gate structure. In other such cases, the bottom portion of the fin structure is removed during final gate processing, thereby allowing for a GAA configuration. In such a case, the isolation structures below the source and drain regions extend up the sidewalls of a bottom portion of the gate structure (where the subfin would have been if not removed). In other embodiments, the fin structure comprising the channel region may be a group IV semiconductor material, such as Si, SiGe, or Ge, or a multilayer structure comprising two distinct group IV semiconductor materials. As will be appreciated, in any such configurations, the isolation structures below the source and drain regions effectively isolate the source and drain regions from the subfin region and thus inhibit subfin leakage.

In one example methodology for forming such as structure, an etch process is carried out to form relatively deep recesses or pockets to either side of the channel region defined by the gate structure. The etch effectively passes through the upper portion of semiconductor fin (in the areas where the source and drain regions will be deposited) and into the material of the lower fin portion. Note that this recess process defines pockets aligned with the source and drain regions. Prior to depositing the source/drain materials, an insulator, such as SiO2 or some other insulating material(s) is deposited to fill the bottom portion of the pockets and replace the material etched from the lower fin portion. The insulator material or structure extends upward along the subfin sidewall at least to a bottom of the channel region of the upper fin portion (or said differently, up to the bottom of the gate structure, which may be a dummy or final gate structure, depending on the gate process used). The source and drain regions can then be epitaxially regrown laterally from the body semiconductor material of the channel region, followed by further processing to complete the transistor.

Note that the laterally grown source and drain regions may include material that is the same as the body/channel material (not counting any dopant), but may also be different. In any case, the laterally grown source and drain regions can be doped (in situ) to provide the desired polarity (PMOS or NMOS). Further note that the further processing after the source and drain regions are provided may include gate-last processing, which generally includes removal of dummy gate materials to expose the channel region between the source and drain regions. In addition, for nanowire or nanoribbon configurations, the bottom portion of the fin structure may also be removed using a further etch that is selective to the top portion of the fin structure (i.e., the selective etch removes the bottom portion of the fin much faster than it removes the top portion of the fin structure). In such cases, note that the selective etch may further expose a sidewall of the isolation structures under the source and drain regions. Thus, in such cases, a bottom portion of the final gate structure will have its sidewalls in contact with the sidewalls of the isolation structures under the source and drain regions.

It should be noted that, while generally referred to herein as a lower fin portion for consistency and ease of understanding the present disclosure, the disclosed semiconductor structures are not limited to that specific terminology and alternatively can be referred to, for example, as a base layer, a subfin layer, a sub-channel layer, or fin stub, or pedestal, or other comparable terms. Similarly, while generally referred to herein as an upper fin portion for consistency and ease of understanding the present disclosure, the disclosed semiconductor structures are not limited to that specific terminology and alternatively can be referred to, for example, as a channel layer or other comparable terms. Also, while generally referred to herein as a semiconductor body or simply body for consistency and ease of understanding the present disclosure, the disclosed semiconductor structures are not limited to that specific terminology and the body alternatively can be referred to, for example, as a channel region, an active channel region, or other comparable terms. Further note that reference to channel region is intended to refer to the semiconductor area under the gate structure where carriers (electrons or holes) will pass when the circuit is powered on and operating under certain conditions. To this end, a channel region does not have to be actively passing carriers for it to be considered a channel region; rather, a transistor has a channel region even when the channel itself is not actively passing carriers (because the transistor is not powered or otherwise conducting).

The use of "group III-V semiconductor material" (or "group III-V material" or generally, "group III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (In-GaAs), indium aluminum arsenide (InAlAs), gallium phosphide (GaP), gallium antimonide (GaSb), indium phosphide (InP), gallium nitride (GaN), and so forth. The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. Group III may also be known as the boron group or IUPAC group 13, group IV may also be known as the carbon group or IUPAC group 14, and group V may also be known as the nitrogen family or IUPAC group 15, for example.

Note also that the term "compositionally different" as used herein with respect to semiconductor materials or features/layers/structures including semiconductor material means (at least) including different semiconductor materials or including the same semiconductor material but with a different compositional ratio (e.g., where the concentration of at least one component of the material is different). For instance, Ge is compositionally different than InGaAs (as they are different semiconductor materials), but Si0.7Ge0.3 is also compositionally different than Si0.4Ge0.6 (as they include different compositional ratios).

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate, for example, a transistor including insulator regions or structures below the source and drain regions, where the insulator extends in contact along a bottom surface of the source or drain region. In another example, such tools may also indicate a fin stub extending upward to contact the channel region or lower gate structure, where the fin stub is generally aligned below the channel and gate structure and has its sidewalls adjacent and in contact with the insulator structures under the source and drain regions. In a further example, such tools may also indicate laterally grown replacement source and drain regions that are distinct from, yet connected to the body or channel region, in accordance with various embodiments of the present disclosure. For example, TEM can be useful to show a cross section of the device structure. In another example, x-ray crystallography can be useful to illustrate the crystal quality of the upper fin material, such as in the body or channel region. In a further example, scanning spreading resistance microscopy (SSRM) can be used to identify a boundary between the channel and source/drain regions based on conductivity of the material. In some embodiments, the techniques described herein may be detected based on the benefits derived from their use, which includes semiconductor devices with reduced or no parasitic subfin leakage according to some embodiments. Numerous configurations and variations will be apparent in light of this disclosure.

Architecture and Methodology

Figure 1B:
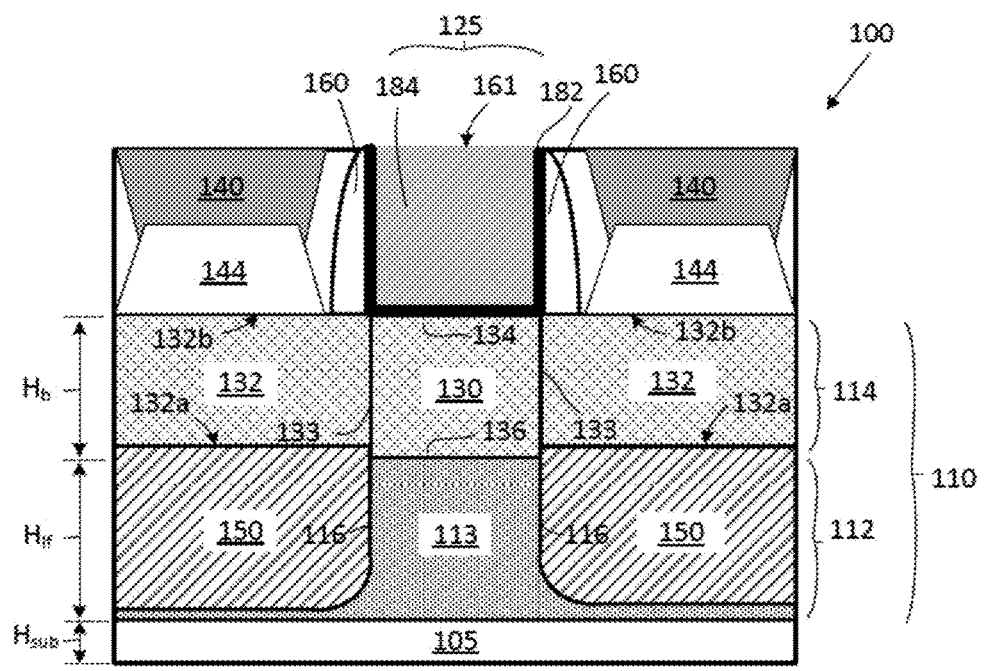
FIG. 1B illustrates a cross-sectional view taken parallel to and through the semiconductor fin structure of a transistor having a tri-gate configuration, wherein insulator material is below the source and drain regions and extends upward along the lower portion (sub-channel) of the fin structure to beyond the bottom surface of the upper portion (channel region) of the fin structure, in accordance with some embodiments of the present disclosure.
Figure 2A:
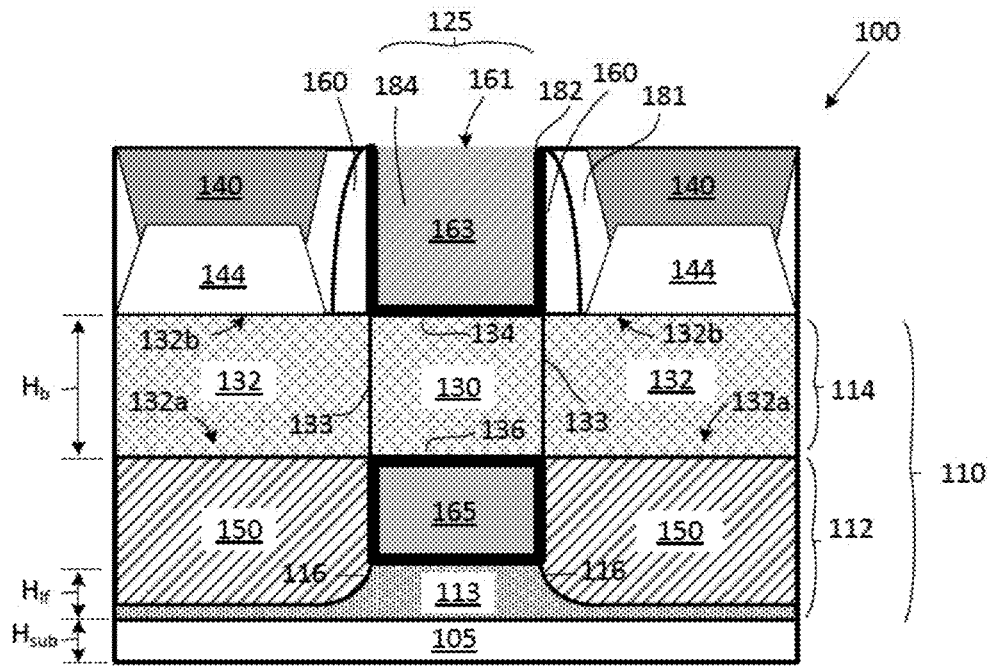
FIG. 2A illustrates a cross-sectional view taken parallel to and through the semiconductor fin structure of a transistor having a gate-all-around configuration, wherein insulator material is below the source and drain regions and extends along the bottom portion of the gate structure to be about even with a top surface of the bottom portion of the gate structure, in accordance with some embodiments of the present disclosure.
Figure 2B:
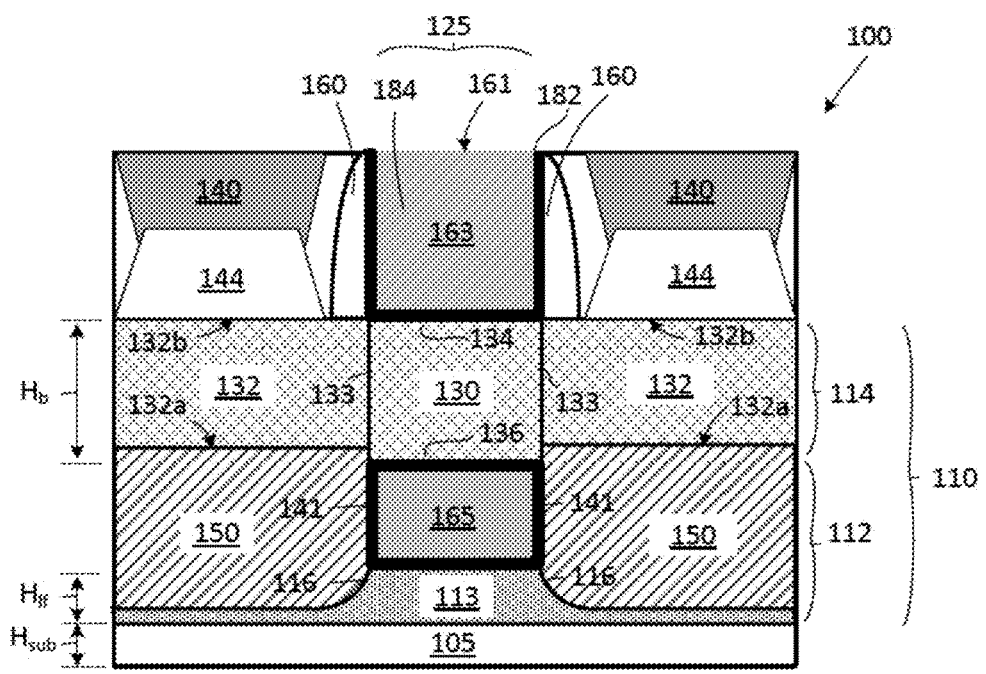
FIG. 2B illustrates a cross-sectional view taken parallel to and through the semiconductor fin structure of a transistor having a gate-all-around configuration, wherein insulator material is below the source and drain regions and extends along the bottom portion of the gate structure to beyond a top surface of the bottom portion of the gate structure, in accordance with some embodiments of the present disclosure.
Figure 3:
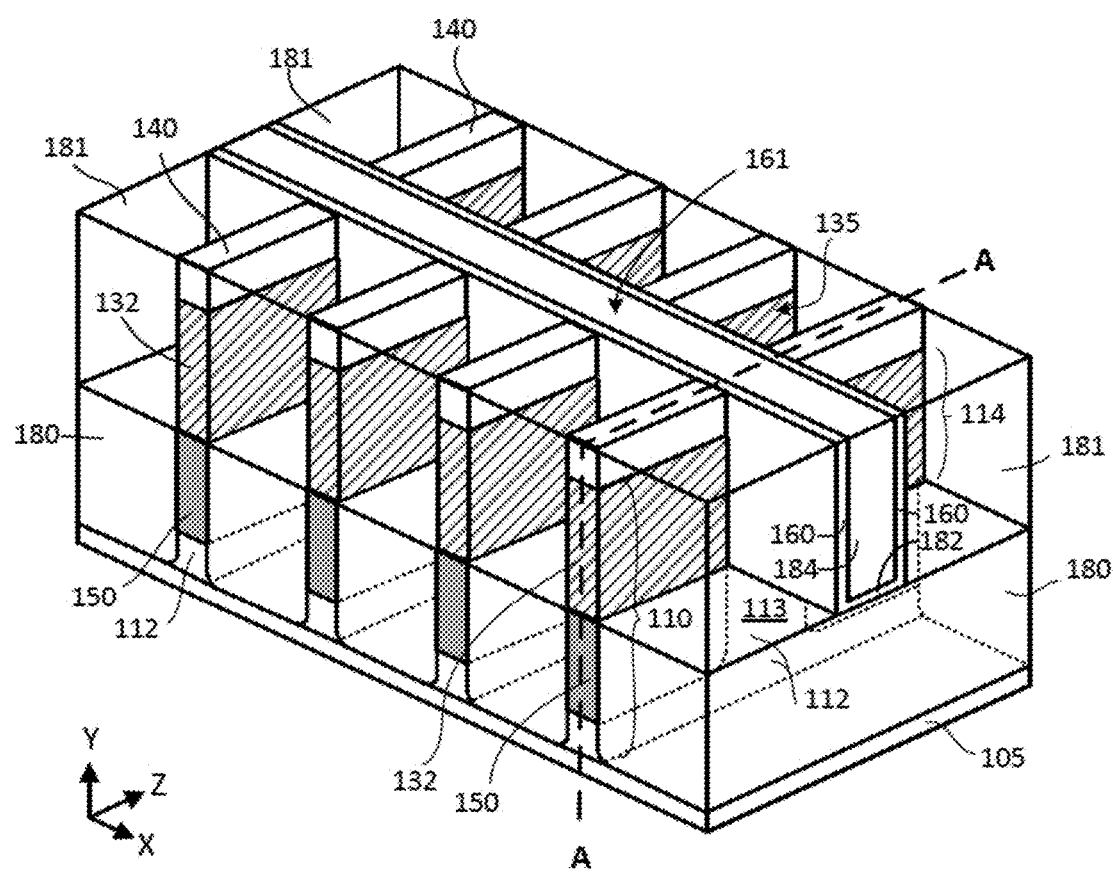
FIG. 3 illustrates a perspective view of an example integrated circuit structure including non-planar transistor devices having isolated source/drain regions, in accordance with some embodiments of the present disclosure. Note that line A-A of FIG. 3 defines an example plane corresponding to the cross-sectional views of FIGS. 1A-1B and 2A-2B, in accordance with some embodiments of the present disclosure.

FIGS. 1A-1B and 2A-2B show example cross-sectional views of the semiconductor fin 110 of a transistor 100, where the section is taken along a plane defined by line A-A of FIG. 3, for example. FIG. 3 illustrates a perspective view of an example structure with a plurality of semiconductor fins 110 on a substrate 105 and a gate structure 161 in contact with and extending perpendicularly to the semiconductor fins 110. In some embodiments, the gate structure 161 has a tri-gate configuration that contacts the top 134 and opposing side walls (e.g., principal faces 135) of the semiconductor fins 110. Examples of a tri-gate configuration are illustrated in the cross-sectional views of FIGS. 1A-1B and the perspective view of FIG. 3. In other embodiments, the gate structure 161 has a gate-all-around configuration that contacts the top 134, bottom 136, and sides 135 of the semiconductor fin 110. Examples of a gate-all-around configuration are illustrated in the cross-sectional views of FIGS. 2A-2B. Various example embodiments of a transistor 100 structure configured in accordance with the present disclosure are discussed in more detail below.

In some embodiments, the substrate 105 can be a bulk semiconductor, a layer of semiconducting material on a support structure, or a non-conducting support substrate, for example. In some embodiments, the substrate 105 is a bulk semiconductor comprising silicon, germanium, silicon germanium, gallium arsenide, indium arsenide, gallium antimonide, indium gallium, arsenide, silicon carbide, or other group IV or group III-V material. In some embodiments, the lower fin portion 112 can be formed from the substrate 105 material. For example, the lower fin portion 112 is a fin formed from the substrate 105 by recessing the surrounding portions of substrate 105 to define one or more fins. In one example, the substrate 105 and the lower fin portion 112 both comprise gallium arsenide (GaAs). In other embodiments, the lower fin portion 112 is compositionally different from the substrate 105. In one example, lower fin portion 112 comprises GaAs, SiGe having a germanium concentration in excess of 50 atomic percent, Ge or other suitable material formed on a substrate 105 of bulk silicon or any other suitable material.

A semiconductor fin can have various structures, depending on the formation process used. In some embodiments, a semiconductor fin is formed on a bulk semiconductor substrate, such as single-crystal silicon, germanium, silicon germanium, or other semiconductor material substrate. In one example fin forming process, native or so-called placeholder fins are first formed from the bulk semiconductor substrate, using a patterned mask and etch process. The resulting recesses between the placeholder fins are then filled with an insulator material, and the resulting structure is planarized to the tops of the placeholder fins. Then, at least some of the placeholder fins are recessed using a patterned mask and an etch process selective to the insulator material. Then, one or more desired replacement materials are deposited into the trench(es) where the placeholder fin(s) used to be. A replacement fin may be one continuous fin or a multiplayer fin structure, such as one having a lower portion comprising a first semiconductor material and an upper portion comprising a second semiconductor material different from the first semiconductor material. In some embodiments, group III-V material is grown on a group IV substrate to replace a recessed or otherwise removed group IV placeholder fin. For example, a layer of GaAs can be formed in the trench and directly on a bulk silicon substrate, followed by forming a layer of InGaAs in the trench and on top of the GaAs material and extending up therefrom in a fin shape.

Semiconductor fin 110 includes a lower fin portion 112 and an upper fin portion 114 formed on top of the lower fin portion 112 and extending upwardly therefrom. The upper fin portion 114 includes a body 130 of a first semiconductor material between and connected to source and drain regions 132 that extend laterally from the body 130. In some embodiments, the body 130 has laterally opposed body sidewalls 133, where the source and drain regions 132 contact and extend laterally from respective opposed body sidewalls 133. The source and drain regions 132 can be of the same or different semiconductor material as the body 130. In one example, the source and drain regions 132 comprise the same semiconductor material as the body 130, but may differ from the body 130 in dopant and/or dopant concentration. In other embodiments, the source and drain regions 132 are compositionally different from the body 130. For example, the body 130 comprises indium gallium arsenide and the source and drain regions 132 comprise indium phosphide or other III-V material formed in contact with the body material. Examples of such processing is discussed in more detail below with reference to method 400 and FIG. 4.

Lower fin portion 112 is formed directly on the substrate 105 and includes a subfin or fin stub 113 with laterally opposed sidewalls 116 that extend up towards or to upper fin portion 114 in accordance with some embodiments. For example, the fin stub 113 has a top surface that contacts a bottom surface 136 of the body 130, where laterally opposed body sidewalls 133 extend continuously with the laterally opposed sidewalls 116 of the fin stub 113. Such an embodiment may be employed in a tri-gate configuration as illustrated in FIGS. 1A-1B, for example. In other embodiments, the fin stub 113 is removed or otherwise spaced apart from a bottom surface 136 of the body 130 by a bottom gate portion 165, where the laterally opposed body sidewalls 133 of the body extend in general alignment but are not continuous with the laterally opposed sidewalls 116 of fin stub 113a. Such an embodiment may be employed in a gate-all-around configuration as illustrated in FIGS. 2A-2B, for example.

In some embodiments, the lower fin portion 112 (and therefore fin stub 113) comprises a second semiconductor material different from the first semiconductor material of the body 130. For example, in some such embodiments, the fin stub 113 is III-V material used as a seed layer for the a second III-V material of the body 130. In one specific embodiment, for example, the lower fin portion 112 and fin stub 113 comprise gallium arsenide and the upper fin portion 114 and body 130 comprise indium gallium arsenide. In other embodiments, the fin stub 113 is a group IV material and the body is a second group IV material. In one example, the fin stub 113 is silicon and the body 130 is silicon germanium (SiGe) or germanium (Ge). As will be appreciated in light of this disclosure, other materials are acceptable for fin stub 113 and body 130 as discussed in more detail below with reference to method 400.

A gate structure 161 directly contacts the top surface 134 of the body 130 of semiconductor fin 110. In some embodiments, the gate structure 161 includes a gate dielectric 182, gate spacers 160, and a gate electrode 184, where the gate dielectric 182 directly contacts yet electrically isolates the gate electrode 184 from the body 130. In general, the body 130 is located below the gate structure 161 and can also be referred to as the channel region. In one embodiment, the transistor 100 is configured as a tri-gate transistor with a gate structure 161 contacting a top 134 and opposite principal faces 135 of the body 130.

When the substrate 105 is oriented horizontally with the semiconductor fins 110 extending upward therefrom, for example, the transistor 100 may exhibit a vertical stack 125 of layers that includes a substrate 105 at the bottom, a fin stub 113 on the substrate 105, the body 130 on the fin stub 113 with the bottom surface 136 of the body 130 contacting the fin stub 113 and the top surface 134 of the body 130 in contact with the gate structure 161, in accordance with some embodiments. Gate structure 161, body 130, and fin stub 113 may each have laterally opposed sidewalls that are vertically aligned with one another in some embodiments. Source and drain regions 132 are located on opposite sides of and extend laterally from the body 130. Insulator regions 150 are located below each of the source and drain regions 132 on opposite sides of the layer stack 125. A bottom surface 132a of each source and drain region 132 extends along and contacts the insulator region 150 below it. Insulator regions 150 also extend to contact the laterally opposed sidewalls 116 of the fin stub 113 of the lower fin portion 112. As such, the insulator regions 150 are positioned to block parasitic leakage of charge carriers from the source and drain regions 132 to the lower fin portion 112.

In another embodiment, such as shown in FIGS. 2A-B, a transistor 100 is configured as a gate-all-around transistor with a gate structure 161 contacting a top 134, bottom 136, and opposite principal faces 135 of the body 130. When the substrate 105 is oriented horizontally with semiconductor fins 110 extending upward therefrom, for example, the transistor 100 having a gate-all-around configuration may exhibit a vertical stack 125 of layers that includes the substrate 105 on the bottom, a lower fin portion 112 on the substrate with a fin stub 113 extending upward, a bottom gate portion 165 on the fin stub 113 with the bottom surface of the bottom gate portion 165 contacting the fin stub 113, the bottom 136 of the body 130 in contact with the top of the bottom gate portion 165, and a top gate portion 163 in contact with top 134 of the body 130, in accordance with some embodiments. As can be further seen in FIGS. 2A-B, laterally opposed sidewalls of the top gate portion 163, body 130, bottom gate portion 165, and fin stub 113 may be vertically aligned in some embodiments. As with embodiments discussed above, source and drain regions 132 extend laterally from the body 130 and an insulator region 150 is located below each source and drain region 132 on opposite sides of the layer stack 125. A bottom 132a of each source and drain region 132 extends along and contacts the insulator region 150 below it. Insulator regions 150 extend laterally to contact the sidewalls of bottom gate portion 165. In some embodiments, insulator regions 150 may also contact the sidewalls 116 of the fin stub 113 below the bottom gate portion 165. As in embodiments discussed above, insulator regions 150 are positioned to block parasitic leakage of charge carriers (or so-called subfin leakage) from source and drain regions 132.

In some embodiments, the insulator regions 150 extend completely through the lower fin portion 112 and contact the substrate 105. In other embodiments, the insulator regions 150 extend into the material of the lower fin portion 112, leaving a base of lower fin material on the substrate and below the insulator region 150. In either case, the insulator regions 150 extend up to be at least even with the bottom 136 of the body 130, such as shown in the example structures of FIGS. 1A and 2A. In other embodiments, the insulator regions 150 extend vertically above the bottom 136 of the body 130 and overlap the body sidewalls 133 (e.g., by at least 1 nm or more, such as by 2 nm to 5 nm) as shown in the example structures of FIGS. 1B and 2B. In embodiments where sidewalls of the insulator regions 150 overlap a portion of the body 130 sidewalls, charge carriers are restricted from flowing from the source or drain regions 132 to the lower fin portion 112. In some embodiments where the gate structure 161 includes a GAA configuration having bottom gate portion 165 below the body 130, the insulator regions 150 sidewalls contact sidewalls 141 of the bottom gate portion 165. In some embodiments, the insulator regions 150 extend vertically below the bottom gate portion 165 and contact the sidewalls 116 of the fin stub 113, as further shown in FIGS. 2A-B.

Source and drain contacts 140 are formed in isolation layer 181 and applied to the top surface 132b of the source and drain regions 132 or to other surfaces as suitable. In some embodiments, a contact resistance reducing layer 144 directly contacts the top surface 132b of the source and drain regions 132 as an interface between the contact 140 and the source/drain region 132. In general, the contact resistance reducing layer 144 has a conductivity type consistent with the conductivity of the underlying source or drain region 132. In one example embodiment, the contact resistance reducing layer 144 is indium arsenide (InAs) on source and drain regions 132 of InGaAs. Other suitable material combinations will be apparent in light of the present disclosure.

In some embodiments, the length Lg of gate electrode 184 (e.g., the horizontal dimension between gate spacers 160 in FIG. 1A), may be any suitable length as can be understood based on this disclosure. For instance, in some embodiments, the gate length Lg may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure. In some embodiments, the gate length Lg may be less than a given threshold, such as less than 100, 50, 40, 30, 25, 20, 15, 10, 8, or 5 nm, or less than any other suitable threshold as will be apparent in light of this disclosure. For instance, in some embodiments, the gate length Lg may be the same as or similar to the channel length. In other embodiments, the gate length may be greater than the body 130 or channel region by up to 20%, due to potential diffusion of dopant from the S/D regions into the body 130 and/or due to the use of S/D region tips that extend under the gate structure.

Referring now to FIG. 3, a perspective view illustrates an example structure that includes a plurality of transistors 100. The relative dimensions and features shown in FIG. 3 may differ in some ways compared to the features shown in FIGS. 1-2 for ease of illustration. Note also that some variations occur between the respective structures shown FIGS. 1-3, such as the shape of gate spacers 160 and the absence of a visible contact resistance reducing layer 144 in FIG. 3, for instance. Some features may be omitted or drawn with different geometry for convenience of illustration, however, the present disclosure is not limited by these differences.

Each semiconductor fin 110 includes a lower fin portion 112 on the substrate 105 and a fin stub 113 that extends up from the substrate 105 to a bottom 136 of the body 130 (not visible; shown in FIGS. 1A-1B). Source and drain regions 132 extend laterally from the body 130, which is hidden below the gate structure 161 in FIG. 3. Each source and drain region 132 includes a source/drain contact 140 on its top surface. The gate structure 161 extends perpendicularly to the semiconductor fins 110 and includes a gate electrode 182 and gate dielectric 184. The gate structure 161 contacts the top 134 and principal faces 135 of each semiconductor fin 110 at the body 130 (not visible). A first isolation layer 180 fills open areas between adjacent lower fin portions 112 of semiconductor fins 110; a second isolation layer 181 on the first isolation layer 180 similarly fills open areas between adjacent upper fin portions 114 of semiconductor fins 110 and gate structure 161, in accordance with some embodiments of the present disclosure. Isolation layers 180, 181 may be the same or different insulating materials, such as a low-k dielectric (e.g., porous SiO2), an oxide (e.g., SiO2), a nitride (e.g., Si3N4), or other insulating material, to name a few examples.

In some embodiments, semiconductor fins 110 of a plurality of different materials may be formed on different areas of the substrate 105, such as for CMOS applications. For instance, a semiconductor fin 110 with a first material may be formed on a first area to be used for one or more p-channel transistor devices (e.g., one or more PMOS devices) and a semiconductor fin 110 with a second material layer may be formed on a second area to be used for one or more n-channel transistor devices (e.g., one or more NMOS devices). By selecting the substrate 105 and material of the lower fin portion 112 to have the desired material characteristics (e.g., the desired semiconductor material and/or the desired lattice constant, for example) the substrate 105 can be used to form semiconductor fins 110 with a variety of high-quality materials for transistor devices.

Figure 4:
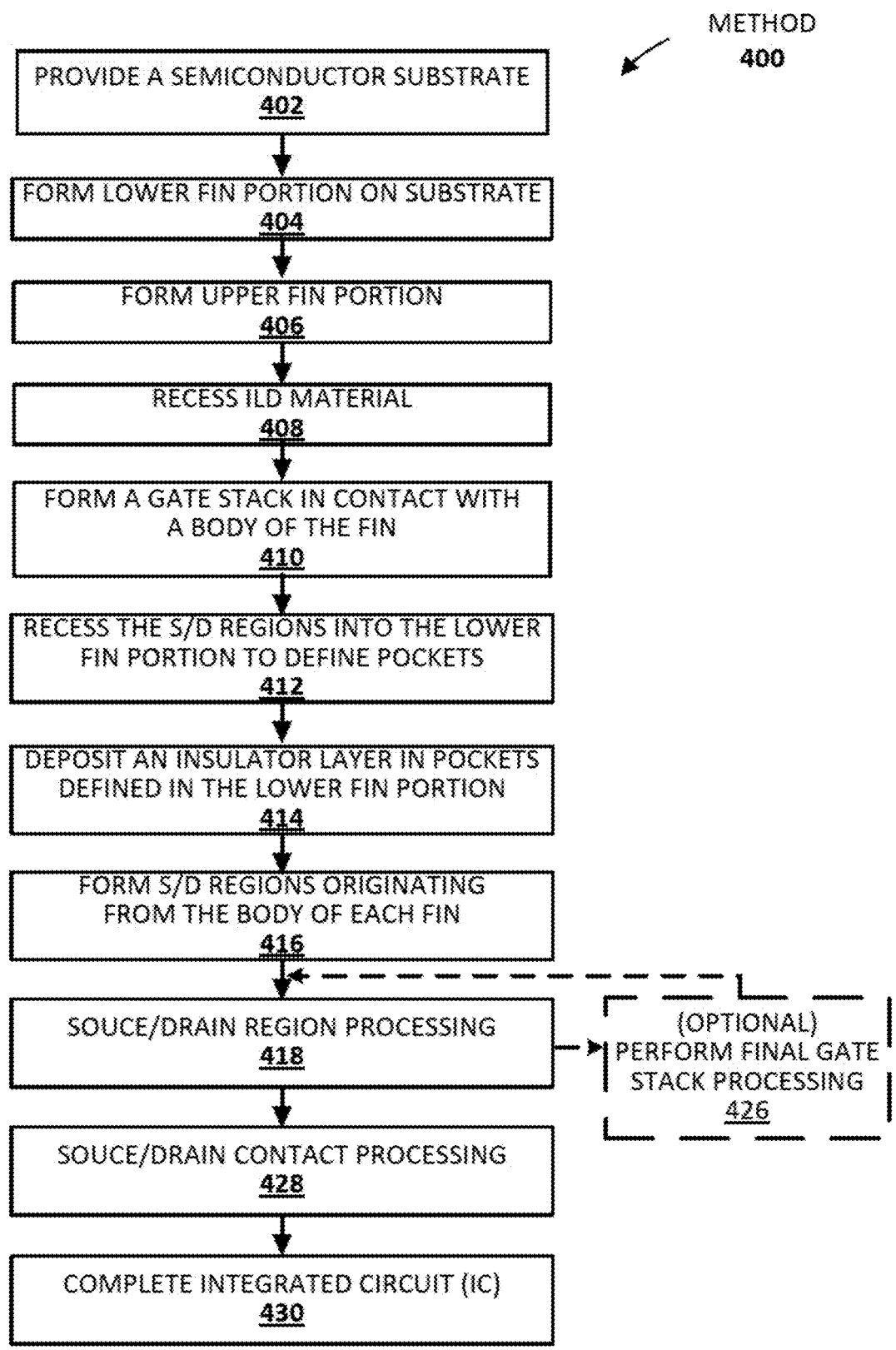
FIG. 4 illustrates a process flow diagram for a method of forming a transistor device having isolated source/drain regions, in accordance with some embodiments of the present disclosure.

Referring now to FIG. 4, an aspect of the present disclosure is directed to a method 400 of making an integrated circuit transistor 100 in accordance with some embodiments of the present disclosure. Note that the techniques for forming the finned structures used in the channel region of one or more transistors may include blanket deposition techniques, replacement fin techniques, and/or any other suitable techniques as will be apparent in light of this disclosure. Further note that method 400 includes a primary path for completion of transistors that illustrates a gate-last transistor fabrication process flow (e.g., a replacement gate process flow), which is utilized in some embodiments. However, in other embodiments, a gate-first process flow may be used, as will be described herein. Numerous variations and configurations will be apparent in light of this disclosure.

Method 400 includes providing 402 a semiconductor substrate 105 in accordance with some embodiments. The substrate 105 in some embodiments, may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the substrate 105 is a bulk wafer, such as monocrystalline silicon, germanium, silicon carbide (SiC), gallium nitride (GaN), and gallium arsenide (GaAs) to name a few examples. The semiconductor material can be selected in some embodiments from group III-V materials and/or group IV materials. Further, the substrate 105 can comprise a semiconductor layer deposited or grown on, or transferred to, a structural base, such as silicon carbide layer epitaxially grown on a sapphire base. Substrate 105, in some embodiments may include a semiconductor on insulator (SOI) structure where an insulator/dielectric material (e.g., an oxide material, such as silicon dioxide) is sandwiched between two semiconductor layers, such as in a buried oxide (BOX) structure. For example, in some such embodiments the SOI structure includes a silicon dioxide layer on a bulk silicon wafer, and a top layer on the silicon dioxide layer is monocrystalline silicon. As will be appreciated, the thickness of the semiconductor substrate (or the semiconductor layer(s) of the substrate, as the case may be) can be any thickness suitable for the devices to be fabricated thereon.

Method 400 continues with forming 404 one or more lower fin portions 112 on the substrate 105, followed by forming 406 one or more upper fin portions 114 on the one or more lower fin portions, in accordance with some embodiments. In some embodiments, the lower fin portions 112 are the same material as the upper fin portions 114, but in other embodiments the lower fin portions 112 are a first material and the upper fin portions 114 are a second material different from the first material. In some embodiments, each lower fin portion 112 and upper fin portion 114 can be formed using any suitable processing, such as one or more of the aforementioned deposition/epitaxial growth processes (e.g., CVD, PVD, ALD, VPE, MBE, LPE), melt regrowth, and/or any other suitable processing, as can be understood based on this disclosure. In one specific example embodiment, for example, each lower fin portion 112 and upper fin portion 114 is formed by growth or deposition in a trench formed in an insulating layer on the substrate 105. In some such embodiments, the trench is an aspect ratio trapping trench ("ART trench") that is formed by removing a previously formed fin that is native to (part of) the substrate 105 using an etch that is selective to insulating material surrounding the native fins (i.e., the etch removes the native fin material at a much faster rate than it removes the insulating material). In some embodiments, the trenches have a vertical trench height (e.g., along the Y-axis direction) from 100-800 nm, for example. Other values of vertical trench height are acceptable depending on the desired overall initial fin height. In any case, once the trenches are formed, the semiconductor material of the lower fin portion 112 is then deposited or grown in the trenches to a certain height (e.g., such as 25 to 50 percent of the overall trench height). Then, the semiconductor material of the upper fin portion 114 is then deposited or grown in the trenches and on top of the lower fin portion 112 to fill the remainder of the trench. The resulting structure can then be planarized as needed (e.g., by chemical mechanical polishing), down to the tops of the newly formed fins (which include lower portion 112 and upper portion 114).

In other embodiments, the lower fin portions 112 and upper fin portions 114 can be formed via a blanket deposition and lithography process to form the fins (including the lower portion 112 and upper portion 114). In some such cases, for example, a blanket of a first semiconductor material is deposited onto substrate 105, and a blanket of a second semiconductor material is then deposited onto the first material. If the first and second materials are different, then additional processing can be carried out between the two depositions, if so desired, such as clean and polish of the first material blanket layer prior to deposition of the second material blanket layer. The blanket depositions are then followed by masking off the regions to be formed into fins and etching isolation trenches in the remaining material to define the lower fin portions 112 (in the first blanket layer) and the upper fin portions 114 (in the second blanket layer). As will be appreciated, the desired heights of the lower fin portions 112 and the upper fin portions 114 can be initially set based on the height of the respective first and second blanket layers.

As previously explained, the lower fin portions 112 may be the same material as the upper fin portions 114, or may be a different material. Having different materials for the lower and upper fin portions may be helpful, for instance, in material systems where a lattice match buffering effect is desired. For example, if the desired substrate 105 material is silicon and the desired channel material (upper fin portion 114) is a group III-V material such as indium gallium arsenide, then using an intervening buffer layer of gallium arsenide (lower fin portion 112) between the substrate 105 and channel materials (upper fin portion 114) may allow the channel material to have fewer or no defects.

In some embodiments, the lower fin portion 112 comprises a III-V semiconductor, such as GaAs, InGaAs, AlGaAs, or AlAs, to name a few examples. In other embodiments, the lower fin portion 112 comprises a group IV semiconductor, such as Si, SiGe, or Ge. In some embodiments, lower fin portion 112 may have a multilayer structure including two or more distinct layers that may or may not be compositionally different. In some embodiments, the lower fin portion 112 may include grading, where one or more material concentrations changes gradually throughout at least a portion of the material.

As can be seen in FIGS. 1A-2B, each lower fin portion 112 may include a vertical height Hlf (dimension in the Y-axis direction), and each upper fin portion 114 may include a vertical height Hb. As can be further seen, each fin portion 112 and 114 has a horizontal fin width (dimension in the X-axis direction, as seen in a cross-section taken perpendicular to the fin). In some example embodiments, fin width is in the range of 2 nm-400 nm (or in any subrange thereof, such as 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm). While in non-planar transistor configurations, fin width will likely be smaller (e.g., less than 50 nm), in planar transistor configurations fin width may be much larger, where the transistor is effectively built on the top of a relatively wide fin or mesa. In some embodiments, the ratio of overall fin height (Hlf plus Hb) to fin width (such as the width taken at a midpoint of either of the fin portions 112 and 114, or at the interface of those fin portions) is greater than 1, such as greater than 1.5, 2, 2.5, 3, 3.5, 4, 4.5, 5, 6, 7, 8, 9, 10, or 20, or higher. Further, in some embodiments, lower fin portions 112 can be formed to have different heights, different fin widths, different vertical starting points (location in the Y-axis direction), different shapes, and/or any other suitable variation(s) as will be apparent in light of this disclosure. Same goes for the upper fin portions 114. In addition, while the fins are shown as having perfectly vertical sidewalls, in other embodiments the sidewalls may be tapered such that width at the top of a given fin (in portion 114) is smaller than width at the bottom (in portion 112) or midpoint of that fin, or may otherwise be less than perfectly vertical. In a more general sense, the fin portions 112 and 114 may have any number of cross-sectional shapes and profiles and may further have any suitable values/ranges/thresholds of height, width, and the ratio or height to width, as will be further apparent in light of this disclosure.

Similarly, trenches used to form lower fin portions 112 and upper fin portions 114 may be formed to have varying trench depths, varying trench widths, varying vertical starting points (location in the Y-axis direction), varying shapes, and/or any other suitable variation(s) as will be apparent in light of this disclosure. For instance, in some cases, a trench may be wider at its top than at its bottom, thereby providing an overall fin shape having similar attributes (wider in portion 114 than in portion 112). Although four semiconductor fins 110 are shown in the example structure of FIG. 3 for ease of illustration, any number of fins may be formed, such as one, two, three, five, ten, hundreds, thousands, millions, and so forth, as will be appreciated. Also, note that the lower fin portions 112 and 114 are shown for ease of illustration in FIGS. 1B and 2B as having height that are relatively greater than the substrate thickness Hsub (dimension in the Y-axis direction) of substrate 105. However, in some embodiments, the thickness Hsub of substrate 105 may be much greater than the overall fin height, for example.

In some embodiments, the lower fin portion 112 can be used as a template or a seeding layer from which to form various different layers of upper fin portion 114, for purposes of providing a quality crystal structure (e.g., low defect count) in the upper fin portion 114. Further, in some such embodiments, the material of lower fin portion 112 may be doped. For instance, in some embodiments, the material of lower fin portion 112 may be intentionally p-type or n-type doped with a doping concentration in the range of 1E15 to 1E18 atoms per cubic cm.

Numerous variations on the fin forming process will be apparent. For instance, in some embodiments, after deposition of the lower fin portion 112 but prior to deposition of the upper fin portion 114, the lower fin portion 112 can be first recessed to a desired height Hlf in the trench that was used to form the lower fin portion 112 (e.g., in the Y-axis direction), which may be more precise than attempting to stop the deposition process at that height. Recessing the material of lower fin portion 112 may be performed by a selective chemical etch or other suitable methods. In one such example embodiment, where the material of lower fin portion 112 is GaAs, an ammonium hydroxide/peroxide solution can be used to recess the GaAs material to the desired height Hlf. In another embodiment, an anisotropic etch can be performed to recess material of the lower fin portion 112. In some embodiments, the lower fin portion 112 is recessed to have a height Hlf in a range from 2 nm-50 nm or any other suitable height as will be apparent in light of this disclosure.

After recessing the material of the lower fin portion 112, the upper fin portion 114 can be formed in the trench on top of the lower fin portion 112 using any suitable deposition techniques as previously explained, in accordance with some embodiments. In some embodiments, the material of upper fin portion 114 may include any suitable semiconductor material, such as monocrystalline group IV and/or group III-V semiconductor material, for example. As can be seen in FIGS. 1A-2B, the upper fin portion 114 may include a vertical height Hb (e.g., dimension in the Y-axis direction). In some embodiments, this height Hb is in the range of 20-300 nm (or in any subrange thereof, such as 20-50, 20-100, 20-200, 20-300, 50-100, 50-200, 50-300, 100-200, 100-300, or 200-300 nm). In some embodiments, the height Hb of the upper fin portion 114 is determined by the depth of the trench used to form the upper fin portion 114 along with the height Hlf of the lower fin portion 112.

In some embodiments, the material of the upper fin portion 114 is selected to be lattice matched or have a lattice mismatch no greater than 4% with respect to the material of the lower fin portion 112. In other embodiments, the material of the upper fin portion 114 has a lattice mismatch of at most 2%, at most 3%, at most 5%, or at most 6% with respect to the material of the lower fin portion 112. As such, the materials of the lower fin portion 112 and the upper fin portion 114 can be selected as a pair of materials having the desired lattice match or other properties that result in the desired crystal quality of the upper fin portion 114. In some embodiments, the material of the upper fin portion 114 is a III-V material with virtually no defects, such as being free of stacking faults and dislocation defects. In other embodiments, the material of the upper fin portion 114 has no more than 1E6 defects per cm2, which in some cases is the resolution limit of TEM analysis. In other embodiments, the material of the upper fin portion 114 has no more than 1E8, no more than 1E9, or no more than 1E10 defects per cm2. In some embodiments, the material of the upper fin portion 114 has a carrier mobility of at least 300 cm2/vs, at least 400 cm2/vs, at least 500 cm2/vs, at least 600 cm2/vs, at least 700 cm2/vs, at least 800 cm2/vs, at least 900 cm2/vs or at least 1000 cm2/vs. Other suitable materials and thickness values/ranges/thresholds will be apparent in light of this disclosure.

In some embodiments, the material of the upper fin portion 114 may include at least one of silicon, germanium, gallium, arsenide, indium, and/or aluminum. In some embodiments, the material of the upper fin portion 114 may be doped with any suitable n-type or p-type dopant at a dopant concentration in the range of 1E15 to 1E18 atoms per cubic cm, for example. For example, in the case of group IV semiconductor materials, the group IV material may be p-type doped using a suitable acceptor (e.g., boron) or n-type doped using a suitable donor (e.g., phosphorous, arsenic). In another example, in the case of group III-V semiconductor material, the group III-V material may be p-type doped using a suitable acceptor (e.g., beryllium, zinc) or n-type doped using a suitable donor (e.g., silicon or magnesium). In other embodiments, the material of the upper fin portion 114 (or a portion thereof) may be intrinsic/undoped or lightly doped with a dopant concentration less than 1E15 atoms per cubic cm. Further, in some embodiments, the upper fin portion 114 may include grading the concentration of one or more materials within the feature, such as a gradual increase or decrease of a semiconductor material component concentration and/or dopant concentration. For instance, the grading may occur as the material of the upper fin portion 114 is epitaxially grown laterally from the lower fin portion 112 (e.g., indium concentration may be graded in an upper fin portion of InGaAs).

Further, in some embodiments, a sacrificial material layer may be initially deposited in the upper fin portion 114 at 406, where the sacrificial material layer may be later removed and replaced with final material layer in the channel region during gate-last processing. Such a sacrificial material layer or part thereof may be employed in embodiments where multiple layers of material define the upper fin portion 114, for example. In one example, a sacrificial material layer is used in the formation of nanowires or nanoribbons. As will be further appreciated, the lower fin portion 112 can also be sacrificial in nature, for purposes of forming nanowire(s) in the upper fin portion 114 (e.g., where the sacrificial materials are removed during gate-last processing to effectively liberate the upper fin portion 114 in the channel region from underlying materials, thereby allowing room for final gate materials to be formed all around the channel region). In another example, a sacrificial material layer is used to define source and drain regions 132 that can be removed in subsequent processing and replaced with final material.

In some embodiments, the upper fin portion 114 of semiconductor fin 110 may include a multilayer structure that includes two or more distinct layers (that may or may not be compositionally different). In some such embodiments, the upper fin portion 114 may be formed using a layer-by-layer epitaxial growth approach (e.g., using an MBE process), such that the upper fin portion 114 may or may not appear to have distinct interfaces within the layer, depending on the particular configuration and observation level. In embodiments where a nanowire (or nanoribbon or GAA) transistor is to be formed from the body 130 of the upper fin portion 114, it may include at least one active layer and at least one sacrificial layer to be removed to release the active layer of material in the channel region to enable forming a nanowire transistor. For instance, in an example embodiment, the upper fin portion 114 may include alternating layers of group IV and group III-V semiconductor material, where either the group IV or group III-V material is sacrificial, to enable the formation of one or more nanowires by selectively removing the sacrificial material during replacement gate processing.

In some embodiments employing multiple different materials in the upper fin portion 114, the first material may include group IV semiconductor material (e.g., Si, SiGe, Ge, etc.) and the second material may include group III-V semiconductor material (e.g., GaAs, InGaAs, InAs, InP, etc.). In general, a given upper fin portion 114 may include monocrystalline group IV semiconductor material and/or group III-V semiconductor material. For instance, in a nanowire or beaded-fin transistor configuration, the upper fin portion 114 may include both group IV semiconductor material and group III-V semiconductor material. Numerous different configurations and variations will be apparent in light of this disclosure.

In some embodiments, multiple different materials for the upper fin portion 114 may be formed in different areas of the substrate 105, such as for CMOS applications, for example. For instance, a first material may be formed on a first area of the substrate 105 to be used for one or more p-channel transistor devices (e.g., one or more PMOS devices) and a second material may be formed on a second area of the substrate 105 to be used for one or more n-channel transistor devices (e.g., one or more NMOS devices). By selecting the material of the lower fin portion 112 to have the desired properties, multiple different layers of upper fin portion 114 can be grown. For instance, in some such embodiments, the first material may include a n-type group III-V or group IV material and a second material may include a p-type group III-V or group IV material.

After forming semiconductor fins 110 with the lower fin portion 112 and the upper fin portion 114, the resulting structure may include one or more isolation layers 180, 181 between adjacent semiconducting fins 110 in accordance with some embodiments. The isolation layers 180, 181 can be recessed 408 or removed completely to expose part or all of semiconductor fins 110 extending up from substrate 105, in accordance with some embodiments. To this end, and with further reference to FIG. 4, method 400 continues with removing or recessing 408 the isolation layers 180, 181 as needed. In some embodiments, such as when the gate structure 161 is a tri-gate structure, the second isolation layer 181 is recessed 408 to expose the upper fin portion 114, where the first isolation layer 180 remains on the substrate 105 and contacts the lower fin portion 112 below the upper fin portion 114. In other embodiments, such as when the gate structure 161 is to be configured as a gate-all-around structure, the isolation layers 180, 181 can be removed completely or as otherwise needed to allow for the GAA processing, in accordance with some embodiments.

Having exposed all or part of the semiconductor fin 110, method 400 continues with forming 410 a dummy gate structure or a final gate structure 161 in contact with the body 130 of the upper fin portion 114, in accordance with some embodiments. A gate-last fabrication process may utilize a dummy gate structure to allow for replacement gate processing, while a gate-first fabrication process may form the final gate structure 161 in the first instance. Forming 410 the gate structure 161 is primarily described herein in the context of a gate-last transistor fabrication flow, where the processing includes forming a dummy gate structure, performing the source/drain (S/D) processing, and then forming the final gate structure 161 after the S/D regions have been processed. In other embodiments, the techniques may be performed using a gate-first process flow. In such example embodiments, a dummy gate structure need not be formed, as the final gate structure 161 can be formed in the first instance. However, the description of the continued processing will be described using a gate-last process flow, to allow for such a gate-last flow to be adequately described. Regardless, the end structure of either a gate-first or a gate-last process flow will include the final gate structure 161, as will be apparent in light of this disclosure.

In this example embodiment, forming 410 a dummy gate structure includes depositing a dummy gate dielectric (e.g., oxide material) and a dummy gate electrode (e.g., polysilicon material), as normally done. Note that gate spacers 160 on either side of the dummy gate structure are also formed in some embodiments. Gate spacers 160 can help determine the channel length and/or help with replacement gate processing, for example. Formation of the dummy gate structure may include, for example, depositing the dummy gate dielectric material and dummy gate electrode material, patterning and etching the dummy gate structure, depositing gate spacer material 160, and performing a spacer etch. Gate spacers 160 may include any suitable material, such as any suitable electrical insulator, dielectric, oxide (e.g., silicon oxide), and/or nitride (e.g., silicon nitride) material, as will be apparent in light of this disclosure. Note that in some embodiments, a hardmask (not shown) may be formed over the dummy gate structure (which may or may not also be formed over gate spacers 160) to protect the dummy gate structure during subsequent processing, for example. As will be appreciated, the dummy gate structure (including gate spacers 160) and body 130 effectively define the channel region, where the channel region corresponds to the body 130 located generally below the dummy gate structure and between the S/D regions 132. Accordingly, the S/D regions 132 are also located on either side of and adjacent the gate structure.

Method 400 continues with recessing 412 the source and drain regions 132 of semiconductor fins 110 to define pockets in the material of the lower fin portion 112 adjacent the channel region, which is located under the gate structure. The source and drain regions 132 may be recessed using any suitable techniques, such as masking regions outside of the S/D regions 132 and etching the exposed areas adjacent the gate structure. In some embodiments, the dummy gate structure can be used as a mask. Accordingly, the exposed areas (where the source and drain regions 132 will be) can be etched through the upper fin portion 114 and into or through lower fin portion 112. Note that a selective etch process can be used in creating the source/drain recesses. For instance, when the upper fin portion 114 is InGaAs and the lower fin portion 112 is GaAs, for example, etchants can be used that are selective to remove these compounds at a rate much greater than removal of the gate structure or hard mask on the gate structure. In some embodiments, etching is performed using a combination of anisotropic and isotropic etch methods. For example, the first 80% of the etch process is performed using an anisotropic etch to remove material downward into the lower fin portion 112, followed by 20% of the etch process performed using an isotropic etch process.

An anisotropic etch process can be an effective first etch step to define a fin stub 113 in the lower fin portion 112, where the fin stub 113 has opposed lateral sidewalls 116 that extend generally vertically and are aligned below the generally vertical portions of gate dielectric 182 of the top gate portion 163 (e.g., vertical ±5°). However, in some examples, an anisotropic etch may result in laterally opposed sidewalls 116 that slope downward and outward, rather than generally vertically. As a result, a residual material layer of the lower fin portion 112 may remain on sidewalls 141 of the bottom gate portion 165, where the residual layer slopes outwardly away from gate dielectric 182 (shown, e.g., in FIGS. 2A-2B, in the context of the final gate structure). The subsequent isotropic etch process can further be employed to define pockets that extend laterally and partially undercut part of the body 130 (in tri-gate embodiments) or fully undercut the body 130 (in gate-all-around embodiments, such as in FIGS. 2A-B), for example. The isotropic etch process may be selective to more rapidly remove material of the lower fin portion 112. The isotropic etch process can therefore be used to recess the material of the lower fin portion 112 downward and laterally to the gate dielectric of the bottom gate portion 165, thereby eliminating any residual layer (e.g., ~2 nm) of material along the sidewalls 141 of bottom gate portion 165 that remain after the anisotropic etch.

Using a combination of anisotropic and isotropic etch processes, or other suitable etch process, the fin stub 113 can be aligned below the body 130 (in tri-gate embodiments) or the bottom gate portion 165 (in gate-all-around embodiments). For example, and with reference to the final gate structure 161, the opposed lateral sidewalls 116 of the fin stub 113 can be formed to align with the respective sidewalls of the gate dielectric 182 between the gate spacers 160 and the gate electrode 184 of the top gate portion 163. Similarly, the opposed lateral sidewalls 116 of the fin stub 113 can be formed to align with the respective sidewalls of the gate dielectric 182 of the bottom get portion 165.

In some example embodiments, the pockets defined for the insulator region 150 extend at least 10 nm below the bottom 136 of the body or channel region. In some such embodiments, where the final gate structure 161 will have a gate-all-around configuration, the etch into the lower fin portion 112 is performed to define pockets that extend down below the bottom gate portion 165. For example, the pockets extend at least 10 nm below the bottom 136 of the body 130, consistent with the vertical thickness of about 10 nm for the bottom gate portion 165, in accordance with some embodiments. In other embodiments, each pocket extends at least 2 nm below the bottom gate portion 165, such as at least 4 nm, at least 6 nm, at least 8 nm, and at least 10 nm below the bottom gate portion 165.

Method 400 continues with depositing 414 an insulator region 150 in the pockets defined by the etch 412 into lower fin portion 112. The insulator region 150 can be a layer of oxide (e.g., SiO2), nitride (e.g., Si3N4), high-k dielectric (e.g., hafnium oxide), low-k dielectric (e.g., porous SiO2), alumina, a spin-on dielectric, or some other insulating material in accordance with some embodiments. The insulator regions 150 can have a vertical layer thickness so that the insulator regions extend up at least to the bottom 136 of the channel region. In some embodiments, the insulator regions 150 extend up above the bottom 136 of the channel region by 2 nm or more, thereby overlapping a portion of the channel region (i.e., body 130). In some embodiments, the insulator regions 150 may include a multilayer structure, such as a first layer comprising a first insulator material and a second layer comprising a second insulator material. Any number of insulator structures can be used for insulator regions 150, as will be appreciated in light of this disclosure.

Method 400 continues with forming 416 replacement source and drain regions 132 that are directly connected to and extend laterally from the body 130 of upper fin portion 114. Replacement source and drain regions 132 take the place of the source and drain regions 132 that were removed when etch processing 412 was performed to define pockets for the insulator regions 150. In some embodiments, the replacement material for the source and drain (S/D) regions 132 can be formed/deposited/grown using any suitable techniques, such as CVD, PVD, ALD, VPE, MBE, or LPE, for example. In some embodiments, material for the source and drain regions 132 is epitaxially grown laterally from the material of body 130 (i.e., the material of upper fin portion 114 located below gate structure 161). In some embodiments, the source and drain regions 132 comprise the same compound as body 130, except perhaps for the presence or concentration of dopants. For instance, the body 130 and source/drain regions 132 are InGaAs, such as In0.53Ga0.47As, in one example embodiment. When the body 130 and source and drain regions 132 are the same material (not considering dopants), the boundary between these structures can be seen using conductive AFM scan or scanning spreading resistance microscopy (SSRM), for example, to identify boundaries based on conductivity. In other embodiments, the source and drain regions 132 are compositionally different from the body 130. For example, when the body 130 is InGaAs, the source and drain regions 132 can be InAs, InP, an InGaAs compound with different molar ratios, or any combination of these materials to name a few examples. In another example, when the body 130 is Si, the source and drain regions 132 can be SiGe, Si, or Ge. Transmission electron microscopy (TEM) can be used to see the boundary between compositionally different materials in accordance with some embodiments.

In some embodiments, the source and drain regions 132 of the upper fin portion 114 are grown epitaxially with a suitable dopant and dopant concentration during growth. As such, an abrupt junction may exist between the source and drain regions 132 and the body 130. In other embodiments, the source and drain regions 132 are formed epitaxially without dopants, then are doped, implanted, and/or clad with final S/D material and/or have any other suitable processing performed to convert the material into suitable final S/D regions 132, for example. The material of the replacement S/D regions 132 also generally defines a distinct interface with the underlying insulator region 150, as will be appreciated.

In some embodiments, one or more of the S/D regions 132 may have a multilayer structure including two or more distinct layers, for example. For instance, in some configurations, the source and drain regions have a bi-layer structure that includes two distinct layers, for example. Numerous such multilayer S/D configurations can be used. In some embodiments, one or more of the S/D regions 132 may include grading (e.g., increasing and/or decreasing) the content/concentration of one or more materials in some or all of the region(s). For instance, in some embodiments, it may be desired to gradually increase the concentration of a given dopant as a given S/D region 132 is formed, to have a relatively lower doping concentration near the channel region and a relatively higher doping concentration near the corresponding S/D contact 140 for improved contact resistance.

In some embodiments, the S/D regions 132 may be formed one polarity at a time, such as performing processing for one of n-type and p-type S/D regions 132, and then performing processing for the other of the n-type and p-type S/D regions 132. In some embodiments, the S/D regions 132 may include any suitable material, such as monocrystalline group IV and/or group III-V semiconductor material and/or any other suitable semiconductor material. In some embodiments, the S/D regions 132 corresponding to the material of body 130 may include the same group of semiconductor material as what is included in the body 130, such that if the given body 130 includes group IV semiconductor material, the corresponding S/D regions 132 may also include group IV semiconductor material (whether the same IV material or different); however, the present disclosure is not intended to be so limited. The S/D regions 132 may include any suitable doping scheme, such as including suitable n-type and/or p-type dopant concentration in the range of 1E18 to 2E22 atoms per cubic cm. However, in some embodiments, at least one S/D region 132 may be undoped/intrinsic or lightly doped, such as including a dopant concentration of less than 1E16 atoms per cubic cm, for example.

Note that for ease of illustration and description, all S/D regions 132 are shown as being the same and are identified collectively by reference numeral 132. However, in some embodiments, the S/D regions 132 may include differing materials, dopant schemes, shapes, sizes, corresponding channel regions (e.g., 1, 2, 3, or more), and/or any other suitable difference as will be appreciated. For instance, the S/D regions 132 of FIG. 3 are shown as having a rectangular fin shape (as viewed in the X-Y plane). However, a faceted shape or a domed shape may also be provisioned, to provide a few examples. Further note that the shading or patterning of the features/layers of the IC structures included in the Figures (such as S/D regions 132) is provided merely to assist in visually distinguishing those different IC features/layers. Such shading or patterning is not intended to limit the present disclosure in any manner. Numerous transistor S/D configurations and variations will be apparent in light of this disclosure.

In embodiments utilizing a gate-last fabrication flow, method 400 continues with processing 426 the final gate structure 161 in accordance with some embodiments. An example structure with a plurality of completed transistors 100 is shown in FIG. 3. In one example embodiment, processing 426 includes depositing an interlayer dielectric (ILD) 181 material on the semiconductor fins, dummy gate structure, and isolation layer 180, followed by planarization and/or polishing (e.g., CMP) to reveal the top of dummy gate structure. Note that in some cases, isolation material 181 and isolation layer 180 may not include a distinct interface as illustrated in FIG. 3, particularly where, the same isolation material is used. In some embodiments, the isolation material 181 may include any suitable insulator material, such as one or more oxides (e.g., silicon dioxide), nitrides (e.g., silicon nitride), dielectrics, and/or an electrically insulating material, for example.

Processing 426 the final gate structure 161, in this example embodiment, includes removing the dummy gate structure (including dummy gate electrode and dummy gate dielectric) to allow for the final gate structure 161 to be formed. Recall that in some embodiments, the formation of the final gate structure 161, which includes gate dielectric 182 and gate electrode 184, may be performed using a gate-first fabrication flow (e.g., an up-front hi-k gate process). In such embodiments, the final gate processing 426 may have been performed prior to the S/D processing 418, for example. Further, in such embodiments, process 426 need not be performed, as the final gate structure 161 would have already been formed in process 410. However, in this example embodiment, the gate structure 161 is formed using a gate-last fabrication flow, which may also be considered a replacement gate or replacement metal gate (RMG) process. Regardless of whether gate-first or gate-last processing is employed, the final gate structure 161 can include gate dielectric 182 and gate electrode 184 as shown in FIG. 3 and described herein, in accordance with some embodiments.

When the dummy gate materials are removed, the body 30 of the semiconductor fin 110 that was covered by the dummy gate structure is exposed to allow for processing of the channel region. In this example, the body 130 is generally synonymous with the channel region since the body 130 is the portion of the semiconductor fin 110 in contact with the dummy gate and will also contact the final gate structure 161. Processing the channel region may include various different techniques, such as removing the body 130 and replacing it with replacement channel region material, shaping the channel region, cladding the channel region, doping the channel region as desired, forming the channel region into one or more nanowires (or nanoribbons) for a gate-all-around (GAA) transistor configuration, forming the channel region into a beaded-fin configuration, cleaning/polishing the channel region, removing all or a portion of the lower fin portion 112, and/or any other suitable processing as will be apparent in light of this disclosure.

The channel region of each semiconductor fin 110, designated in this example by the body 130, may include any suitable configuration, such as a finned configuration, a nanowire configuration, or a beaded configuration to name some examples. For instance, in some embodiments, the channel region may include a material that is compositionally different from the original material of upper fin portion 114. Thus, a fin-shaped body 130 may be used for an n-channel or p-channel finned transistor device, while body 130 of another configuration may be used for the other of an n-channel or p-channel finned transistor device, in accordance with an example embodiment. Further, in some embodiments, channel region of a given semiconductor fin may be included in a complementary transistor circuit (e.g., a CMOS circuit), for instance.

In addition to finned configurations utilizing a tri-gate or double-gate structure, other non-planar transistor configurations can be used. In some embodiments, a nanowire channel region includes one or more nanowires (or nanoribbons). For instance, nanowires may be formed after removing the dummy gate structure to expose the body 130, such as by converting the fin-shaped body 130 at that location into nanowires using any suitable techniques. For example, the original fin-shaped body 130 may have included a multilayer structure with one or more sacrificial layers. In such case, a selective etch can be performed to remove the sacrificial layer(s) and define the nanowires. In some embodiments, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the final gate structure 161 wraps around each fin-shaped nanowire or nanoribbon in a GAA transistor configuration, such as shown in the cross-sectional views of FIGS. 2A-2B.

To provide yet another example non-planar transistor configuration, body 130 can have a beaded-fin configuration that is a hybrid between a finned configuration and a nanowire configuration, where a sacrificial material can be partially removed to define the resulting beaded-fin or hour-glass shaped structure. In contrast, a sacrificial material can be completely removed to define nanowires. Such a beaded-fin configuration for body 130 may benefit, for example, from increased gate control (e.g., compared to a fin-shaped structure) while also having relatively reduced parasitic capacitance (e.g., compared to a nanowire structure). Therefore, numerous different configurations of the channel region can be employed using the techniques described herein, including planar and various non-planar configurations.

The channel region is generally at least below the final gate structure 161, in some embodiments. For instance, in the case of a planar transistor configuration, the gate structure 161 may contact the channel region only on the top surface, for example. However, in the case of a finned transistor configuration, such as shown in the tri-gate configuration of FIGS. 1A-1B and FIG. 3, the body 130 may be below and between the gate structure 161, since the gate structure 161 can be formed on the top 134 and in contact with opposite principal faces 135 of the finned structure (e.g., in a tri-gate manner). Further, in the case of a GAA transistor configuration, such as shown in FIGS. 2A-2B, the gate structure 161 may substantially (or completely) surround each nanowire/nanoribbon in the channel region (e.g., wrap around at least 80, 85, 90, or 95% of each nanowire/nanoribbon).

Generally, in some embodiments, the body 130 or channel region may include any suitable material, such as monocrystalline group IV and/or group III-V semiconductor material, for example. In some embodiments, the channel region of a given transistor 100 may be doped (e.g., with any suitable n-type and/or p-type dopants) or intrinsic/undoped, depending on the particular configuration. Note that S/D regions 132 are adjacent to either side of a given channel region and therefore adjacent either side of the gate structure 161, as can be seen in FIGS. 1-3. In other words, each body/channel region is positioned between corresponding S/D regions 132.

The gate dielectric 182 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 182 to improve its quality when high-k dielectric material is used. The gate electrode 184 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric 182 and/or gate electrode 184 may include a multilayer structure of two or more material layers, for example. For instance, in some embodiments, a multilayer gate dielectric 182 may be employed where the structure includes a first layer of oxide native to the underlying body 130 material, and a second layer of hafnium oxide on the native oxide. In such cases, note that it may be difficult to distinguish the native oxide portion of the gate dielectric structure from the underlying insulator layer, particularly if those two features are the same material. In any case, however, they are different layers since one layer is formed by deposition and the native oxide portion of the gate dielectric is formed by an oxidation process, for example. Likewise, the gate electrode may include multiple layers, such as one or more relatively high or low work function layers and/or other suitable layers. Example work function materials for PMOS devices include, for instance, titanium nitride, tantalum nitride, ruthenium, palladium, platinum, cobalt, nickel, and conductive metal oxides (e.g., ruthenium oxide). Example work function materials for NMOS devices include, for instance, hafnium, zirconium, titanium, tantalum, aluminum, alloys of these metals, and carbides of these metals such as hafnium carbide, zirconium carbide, titanium carbide, tantalum carbide, and aluminum carbide. Numerous different gate structure configurations will be apparent in light of this disclosure.

Method 400 continues with forming 428 S/D contacts 140 in accordance with some embodiments. As shown in FIG. 3, for example, S/D contacts 140 can be formed in contact with a top surface 132b of each of the S/D regions 132. The S/D contacts 140 may be formed 428 using any suitable techniques, such as forming contact trenches in ILD layer 181 over the respective S/D regions 132 and depositing metal or metal alloy (or other suitable electrically conductive material) in the trenches. In some embodiments, forming 428 S/D contacts 140 may include silicidation, germanidation, III-V-idation, and/or annealing processes, for example. In some embodiments, S/D contacts 140 may include aluminum or tungsten, although any suitable conductive metal or alloy can be used, such as titanium, copper, silver, nickel-platinum, or nickel-aluminum, for example. In some embodiments, one or more of the S/D contacts 140 may include a resistance reducing metal and a contact plug metal, or just a contact plug, for instance. Examples of metals that reduce contact resistance include, for instance, nickel, aluminum, titanium, gold, gold-germanium, nickel-platinum, nickel aluminum, and/or other such resistance reducing metals or alloys. Examples of contact plug metals include, for instance, aluminum, copper, nickel, platinum, titanium, or tungsten, or alloys thereof, although any suitably conductive contact metal or alloy may be used. In some embodiments, additional layers may be present in the S/D contact 140 regions, such as adhesion layers (e.g., titanium nitride) and/or liner or barrier layers (e.g., tantalum nitride), if so desired. In some embodiments, a contact resistance reducing layer 144 may be present between a given S/D region 132 and its corresponding S/D contact 140 as shown, for example, in FIGS. 1-2. The contact resistance reducing layer 144 is an intervening semiconductor material layer between the material of the S/D region and the S/D contact 140. The contact resistance reducing layer 144 can have a relatively high dopant concentration (e.g., with dopant concentrations greater than 1E18, 1E19, 1E20, 1E21, or 1E22 atoms per cubic cm), for example. In some such embodiments, the contact resistance reducing layer 144 may include semiconductor material and/or impurity dopants based on the included material and/or dopant concentration of the corresponding S/D region 132, for example. In one example embodiment, the contact resistance reducing layer 144 is indium arsenide formed on S/D regions 132 of InGaAs, for example.

Method 400 continues with completing 430 a general integrated circuit (IC) as desired, in accordance with some embodiments. Such additional processing to complete 430 an IC may include back-end or back-end-of-line (BEOL) processing to form one or more metallization layers and/or to interconnect the transistor devices formed, for example. Any other suitable processing may be performed, as will be apparent in light of this disclosure. Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

A multitude of different transistor devices can benefit from the techniques described herein, including, but not limited to, various field effect transistors (FETs), n-channel devices (e.g., NMOS), and/or p-channel devices (e.g., PMOS). In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. Further, techniques of the present disclosure may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Example System

Figure 5:
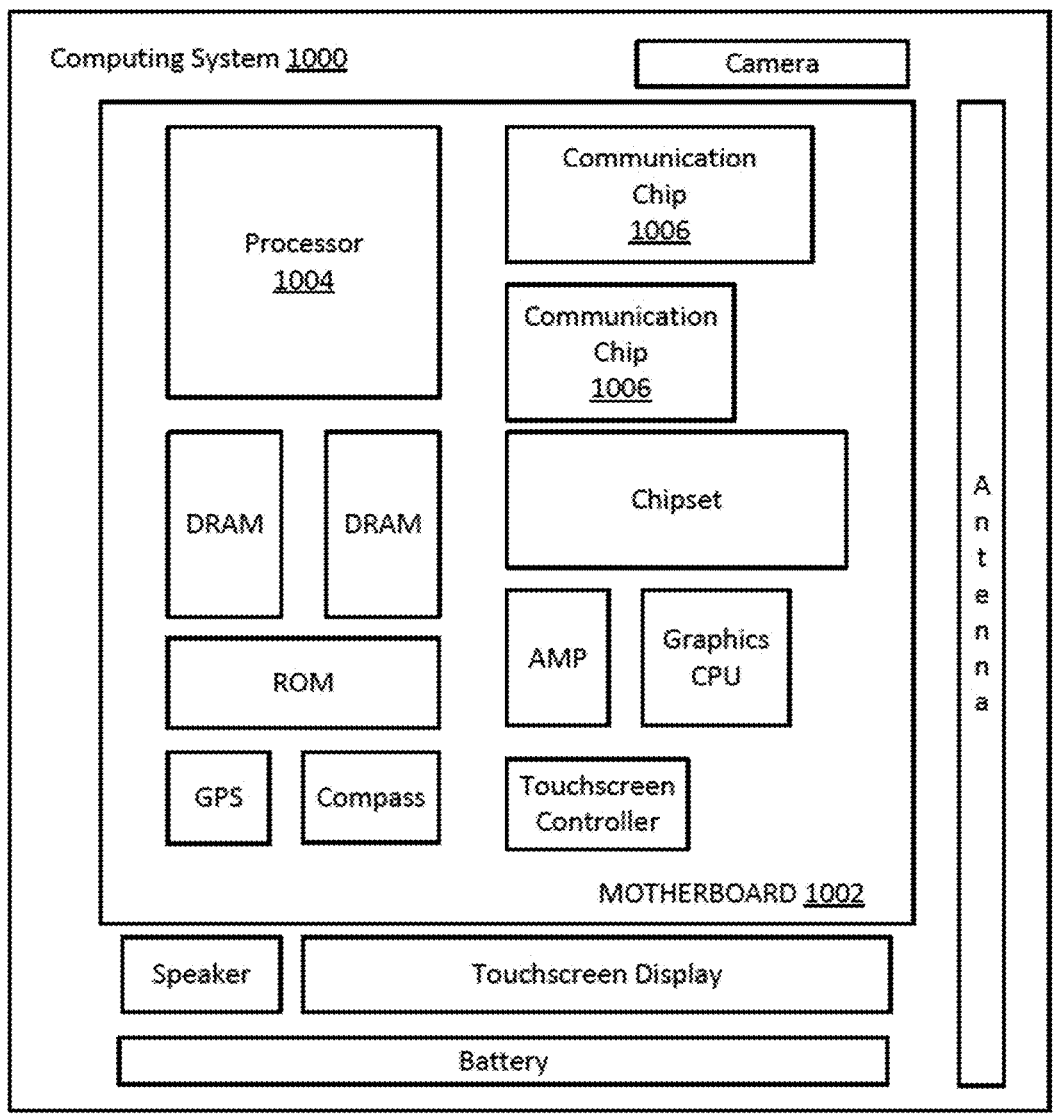
FIG. 5 illustrates an example computing system implemented with integrated circuit structures and/or transistor devices formed, in accordance with some embodiments of the present disclosure.

FIG. 5 illustrates an example computing system 1000 including integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit comprising a body of semiconductor material, the body having laterally opposed body sidewalls and a top surface; a gate structure in contact with the top surface of the body; a source region in contact with a first one of the laterally opposed body sidewalls; a drain region in contact with a second one of the laterally opposed body sidewalls; a first isolation region under the source region and having a top surface in contact with a bottom surface of the source region; and a second isolation region under the drain region and having a top surface in contact with a bottom surface of the drain region.

Example 2 includes the subject matter of Example 1, wherein the gate structure has a gate-all-around configuration with the gate structure further in contact with a bottom surface of the body.

Example 3 includes the subject matter of Example 1, wherein the semiconductor material is a first semiconductor material, the integrated circuit further comprising a fin stub of a second semiconductor material, the fin stub having a top surface in contact with a bottom surface of the body and laterally opposed sidewalls extending down from the top surface of the fin stub, wherein a first one of the laterally opposed sidewalls of the fin stub contacts the first isolation region and a second one of the laterally opposed sidewalls of the fin stub contacts the second isolation region.

Example 4 includes the subject matter of Example 3, wherein the second semiconductor material is a group III-V compound.

Example 5 includes the subject matter of Example 4, wherein the second semiconductor material comprises gallium and arsenic.

Example 6 includes the subject matter of any of Examples 3-5, wherein the first semiconductor material is a group III-V compound.

Example 7 includes the subject matter of Example 6, wherein the first semiconductor material comprises indium, gallium, and arsenic.

Example 8 includes the subject matter of Example 3, wherein the second semiconductor material is a group IV compound.

Example 9 includes the subject matter of Example 8, wherein the second semiconductor material comprises silicon.

Example 10 includes the subject matter of Examples 3, 8, or 9, wherein the first semiconductor material is a group IV compound.

Example 11 includes the subject matter of Example 10, wherein the first semiconductor material comprises (i) silicon, (ii) silicon and germanium, or (iii) germanium.

Example 12 includes the subject matter of any of Examples 3-11, wherein the fin stub is continuous with and part of a layer of the second semiconductor material directly on a substrate.

Example 13 includes the subject matter of Example 12, wherein the substrate comprises a bulk semiconductor material.

Example 14 includes the subject matter of Example 13, wherein the bulk semiconductor material is a group IV material, wherein the group IV material comprises (i) monocrystalline silicon, (ii) monocrystalline germanium, (iii) a material with at least 80 atomic percent germanium, or (iv) silicon and germanium.

Example 15 includes the subject matter of Example 1, wherein the semiconductor material is a first semiconductor material, the integrated circuit further comprising a fin stub of a second semiconductor material that is compositionally different from the first semiconductor material.

Example 16 includes the subject matter of any of Examples 3 through 15, wherein the first semiconductor material has a lattice mismatch no greater than 4% with respect to the second semiconductor material.

Example 17 includes the subject matter of any of Examples 3 through 15, wherein the first one of the laterally opposed body sidewalls is vertically aligned with the first one of the laterally opposed sidewalls of the fin stub, the second one of the laterally opposed body sidewalls is vertically aligned with the second one of the laterally opposed sidewalls of the fin stub.

Example 18 includes the subject matter of any of Examples 3 through 15, wherein the first isolation region has a sidewall that at least partially overlaps with and is in contact with the first one of the laterally opposed sidewall of the fin stub, and the second isolation region has a sidewall that at least partially overlaps with and is in contact with the second one of the laterally opposed sidewall of the fin stub.

Example 19 includes the subject matter of Example 18, wherein the first isolation region extends at least 10 nm below the source region and the second isolation region extends at least 10 nm below the drain region.

Example 20 includes the subject matter of Example 18 or 19, wherein the sidewall of the first isolation region partially overlaps with and is in contact with the first one of the laterally opposed body sidewalls, and the sidewall of the second isolation region partially overlaps with and is in contact with the second one of the laterally opposed body sidewalls.

Example 21 includes the subject matter of Example 20, wherein the sidewall of the first isolation region overlaps the first one of the laterally opposed body sidewalls by at least 2 nm and the sidewall of the second isolation region overlaps the second one of the laterally opposed body sidewalls by at least 2 nm.

Example 22 includes the subject matter of any of Examples 1 through 21, wherein the gate structure is a tri-gate structure.

Example 23 includes the subject matter of any of the foregoing Examples, wherein the semiconductor material has virtually no defects.

Example 24 includes the subject matter of any of the foregoing Examples, wherein the body has a carrier mobility of at least 600 cm2/vs.

Example 25 includes the subject matter of Example 24, wherein the carrier mobility is at least 700 cm2/vs.

Example 26 includes the subject matter of Example 24, wherein the carrier mobility is at least 800 cm2/vs.

Example 27 includes the subject matter of any of the foregoing Examples, wherein the body, gate structure, source region, drain region, and first and second isolation regions are part of a transistor, and the transistor is one of a field effect transistor (FET), a metal-oxide-semiconductor FET (MOSFET), a tunnel-FET (TFET), a planar configuration, a finned configuration, a gate-all-around configuration, or a Fin-FET configuration, and wherein the transistor is one of a n-channel transistor and a p-channel transistor.

Example 28 includes the subject matter of any of Examples 1 through 15 further comprising a fin stub having a top surface spaced apart from a bottom surface of the body, wherein the gate structure has a gate-all-around configuration that includes a lower gate portion below that is below the body, the lower gate portion in contact with: a bottom surface of the body, respective sidewalls of the first and second isolation regions, and the top surface of the fin stub.

Example 29 includes the subject matter of any of the foregoing Examples, further comprising a complementary metal-oxide-semiconductor (CMOS) circuit including a first transistor and a second transistor, the first transistor including the body, gate structure, source region, drain region, and first and second isolation regions, wherein one of the first and second transistors is an n-channel transistor and the other of the first and second transistors is a p-channel transistor.

Example 30 includes the subject matter of any of the foregoing Examples, wherein the first isolation region and the second isolation region comprise an insulating material, the insulating material including an insulating oxide, an insulating nitride, a high-k dielectric, a low-k dielectric, or any combination of these insulating materials.

Example 31 is an integrated circuit comprising: a semiconductor fin comprising an upper fin portion of a first semiconductor material, the upper fin portion having a body portion having first and second sides, wherein a source region is laterally adjacent and directly connected to the first side, and a drain region is laterally adjacent and directly connected to the second side; a lower fin portion of a second semiconductor material, the lower fin portion having a fin stub with laterally opposed sidewalls extending upwardly towards the upper fin portion; a gate structure in direct contact with the body portion; a first insulator structure below the source region and having a first insulator top surface in contact with a bottom surface of the source region; and a second insulator structure below the drain region and having a second insulator top surface in contact with a bottom surface of the drain region; wherein the fin stub is positioned between the first insulator and the second insulator with a first one of the laterally opposed sidewalls in contact with a sidewall of the first insulator structure and a second one of the laterally opposed sidewalls in contact with a sidewall of the second insulator structure.

Example 32 includes the subject matter of Example 31, wherein the fin stub has a top surface in contact with a bottom surface of the body portion.

Example 33 includes the subject matter of Example 31 or 32, wherein the first semiconductor material is the same as the second semiconductor material.

Example 34 includes the subject matter of Example 31, wherein the fin stub has a top surface that is spaced apart from a bottom surface of the body portion, and wherein the gate structure includes a top gate portion in contact with a top surface of the body portion and a bottom gate portion in contact with a bottom surface of the body portion, and wherein the fin stub has a top surface in contact with a bottom surface of the bottom gate portion, and wherein respective sidewalls of the bottom gate portion are in contact with corresponding sidewalls of the first and second insulator structures.

Example 35 includes the subject matter of Example 34, wherein the first insulator structure and the second insulator structure extend along and are in contact with both the bottom gate portion and at least a portion of the fin stub.

Example 36 includes the subject matter of Example 31, wherein the first insulator structure and the second insulator structure extend at least 10 nm below the body portion.

Example 37 includes the subject matter of any of Examples 31-32 or 34-36, wherein the first semiconductor material is a group III-V compound and the second semiconductor material is a group III-V compound compositionally different from the first semiconductor material.

Example 38 includes the subject matter of any of Examples 31-37, wherein the first semiconductor material comprises (i) gallium and arsenic, (ii) indium, gallium, and arsenic, (iii) indium and phosphorous, (iv) indium and arsenic, (v) germanium, or (vi) silicon and germanium.

Example 39 includes the subject matter of any of Examples 31-37, wherein the first semiconductor material is a group IV compound and the second semiconductor material is a group IV compound compositionally different from the first semiconductor material.

Example 40 includes the subject matter of Example 39, wherein the first semiconductor material comprises (i) germanium, (ii) silicon and germanium, or (iii), silicon.

Example 41 includes the subject matter of any of Examples 31 through 40, wherein the first semiconductor material has a lattice mismatch no greater than 4% with respect to the second semiconductor material.

Example 42 includes the subject matter of any of Examples 31-40 further comprising a substrate of bulk semiconductor material, wherein the lower fin portion is on the substrate.

Example 43 includes the subject matter of Example 42, wherein the bulk semiconductor material comprises a group IV material.

Example 44 includes the subject matter of Example 43, wherein the group IV material comprises (i) monocrystalline silicon, (ii) monocrystalline germanium, (iii) a material with at least 80 atomic percent germanium, or (iv) silicon and germanium.

Example 45 includes the subject matter of Example 42, wherein the substrate is a bulk silicon substrate.

Example 46 includes the subject matter of any of Examples 31 through 40, wherein the first insulator structure extends at least 10 nm below the source region and the second insulator structure extends at least 10 nm below the drain region.

Example 47 includes the subject matter of any of Examples 31 through 40, wherein the first insulator structure and the second insulator structure extend at least 2 nm along the body portion.

Example 48 includes the subject matter of any of Examples 31 through 40, wherein the body portion has laterally opposed body sidewalls vertically aligned with respective ones of the laterally opposed sidewalls of the fin stub.

Example 49 includes the subject matter of any of Examples 31 through 40, wherein the gate structure is a tri-gate structure.

Example 50 includes the subject matter of any of Examples 31 through 40, wherein the first semiconductor material has a carrier mobility of at least 600 cm2/vs.

Example 51 includes the subject matter of Example 50, wherein the carrier mobility is at least 700 cm2/vs.

Example 52 includes the subject matter of Example 50, wherein the carrier mobility is at least 800 cm2/vs.

Example 53 includes the subject matter of any of Examples 31-52, wherein the body, gate structure, source region, drain region, and first and second isolation regions are part of a transistor, and the transistor is one of a field effect transistor (FET), a metal-oxide-semiconductor FET (MOSFET), a tunnel-FET (TFET), a planar configuration, a finned configuration, a gate-all-around configuration, or a Fin-FET configuration, and wherein the transistor is one of a n-channel transistor and a p-channel transistor.

Example 54 includes the subject matter of any of Examples 31 through 40, wherein the first isolation region and the second isolation region comprise an insulating material, the insulating material including an insulating oxide, an insulating nitride, a high-k dielectric, a low-k dielectric, or any combination of these insulating materials.

Example 55 includes the subject matter of any of Examples 31 through 40, wherein the first insulator structure and the second insulator structure comprise an insulating material selected from silicon dioxide, silicon nitride, aluminum oxide, hafnium oxide, titanium dioxide, a dielectric, pores, and alumina.

Example 56 is a computing system comprising the integrated circuit of any of Examples 1-55.

Example 57 includes the subject matter of Example 56, wherein the integrated circuit is a communication chip.

Example 58 includes the subject matter of Example 56, wherein the integrated circuit is a touch screen controller.

Example 59 includes the subject matter of Example 56, wherein the integrated circuit is a memory.

Example 60 is a method of forming a transistor, the method comprising: forming a gate structure in contact with a semiconductor body; forming a first recess to a first side of the gate structure and a second recess to a second side of the gate structure, the first and second recesses extending past the semiconductor body and the gate structure, so as to expose laterally opposing sidewalls of the semiconductor body; partially filling the first and second recesses with an insulator material so as to provide first and second insulator structures, respectively, the height of the insulator material in the first and second trenches being at least up to a bottom surface of the semiconductor body; and forming a source region in the first recess and on top of the first insulator structure, and a drain region in the second recess and on top of the second insulator structure, wherein each of the source region and drain region is directly connected to and extending laterally from the semiconductor body.

Example 61 includes the subject matter of Example 60, wherein forming the gate structure includes removing a portion of semiconductor material below the body with the gate structure in contact with a bottom surface of the body.

Example 62 includes the subject matter of Example 60 or 61 and further comprises depositing a source contact on the source region; and depositing a drain contact on the drain region.

Example 63 includes the subject matter of any of Examples 60 through 62, wherein forming the source region and the drain region is performed by epitaxial lateral growth from the respective sidewalls of the semiconductor body.

Example 64 includes the subject matter of Example 63, wherein the epitaxial lateral growth includes supplying a dopant to the source region and the drain region.

Example 65 includes the subject matter of Example 63, wherein the source region and the drain region are compositionally different from the semiconductor body.

Example 66 includes the subject matter of any of Examples 60-65, wherein the gate structure is a dummy gate structure, the method further comprising: removing the dummy gate structure; processing the body to define one or more nanowires, one or more nanoribbons, or a beaded fin structure in the body; and forming a final gate structure on the body.

Example 67 includes the subject matter of any of Examples 60-66, wherein forming the first and second recesses is performed using a combination of an anisotropic etch and an isotropic etch.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a body of semiconductor material, the body having a bottommost surface;
a gate structure in contact with and completely surrounding a portion of the body, the gate structure defining a channel region in the body;
a source region in contact with the body;
a drain region in contact with the body such that the portion of the body in contact with the gate structure is between the source region and the drain region;
a first isolation region under an entirety of the source region and having a top surface in contact with an entirety of a bottom surface of the source region laterally adjacent to the channel region, the first isolation region having an uppermost surface above the bottommost surface of the body, and the first isolation region having a bottommost surface below the bottommost surface of the body, wherein the body is not vertically intervening between the first isolation region and the source region; and
a second isolation region under an entirety of the drain region and having a top surface in contact with an entirety of a bottom surface of the drain region laterally adjacent to the channel region, the second isolation region having an uppermost surface above the bottommost surface of the body, and the second isolation region having a bottommost surface below the bottommost surface of the body, wherein the body is not vertically intervening between the second isolation region and the drain region.

2. The integrated circuit of claim 1, wherein the semiconductor material is a first semiconductor material, the integrated circuit further comprising a fin stub of a second semiconductor material, the fin stub having a top surface vertically beneath and spaced apart from the bottommost surface of the body and laterally opposed sidewalls extending down from the top surface of the fin stub, wherein a first one of the laterally opposed sidewalls of the fin stub contacts the first isolation region and a second one of the laterally opposed sidewalls of the fin stub contacts the second isolation region.

3. The integrated circuit of claim 2, wherein the fin stub is continuous with and part of an underlying substrate.

4. The integrated circuit of claim 2, wherein the first isolation region has a sidewall that at least partially interfaces with and is in contact with the first one of the laterally opposed sidewall of the fin stub, and the second isolation region has a sidewall that at least partially interfaces with and is in contact with the second one of the laterally opposed sidewall of the fin stub.

5. The integrated circuit of claim 4, wherein the sidewall of the first isolation region partially interfaces with the first one of the laterally opposed body sidewalls for at least 2 nm and the sidewall of the second isolation region partially interfaces with the second one of the laterally opposed body sidewalls for at least 2 nm.

6. An integrated circuit comprising:
a body of semiconductor material, the body having a bottommost surface;
a gate structure in contact with and completely surrounding a portion of the body, the gate structure defining a channel region in the body;
a source region in contact with the body;
a drain region in contact with the body such that the portion of the body in contact with the gate structure is between the source region and the drain region;
a first isolation region under an entirety of the source region and having a top surface in contact with an entirety of a bottom surface of the source region laterally adjacent to the channel region, the first isolation region having an uppermost surface at a same level as the bottommost surface of the body, and the first isolation region having a bottommost surface below the bottommost surface of the body, wherein the body is not vertically intervening between the first isolation region and the source region; and
a second isolation region under an entirety of the drain region and having a top surface in contact with an entirety of a bottom surface of the drain region laterally adjacent to the channel region, the second isolation region having an uppermost surface at a same level as the bottommost surface of the body, and the second isolation region having a bottommost surface below the bottommost surface of the body, wherein the body is not vertically intervening between the second isolation region and the drain region.

7. The integrated circuit of claim 6, wherein the semiconductor material is a first semiconductor material, the integrated circuit further comprising a fin stub of a second semiconductor material, the fin stub having a top surface vertically beneath and spaced apart from the bottommost surface of the body and laterally opposed sidewalls extending down from the top surface of the fin stub, wherein a first one of the laterally opposed sidewalls of the fin stub contacts the first isolation region and a second one of the laterally opposed sidewalls of the fin stub contacts the second isolation region.

8. The integrated circuit of claim 7, wherein the fin stub is continuous with and part of an underlying substrate.

9. The integrated circuit of claim 7, wherein the first isolation region has a sidewall that at least partially interfaces with and is in contact with the first one of the laterally opposed sidewall of the fin stub, and the second isolation region has a sidewall that at least partially interfaces with and is in contact with the second one of the laterally opposed sidewall of the fin stub.

10. The integrated circuit of claim 9, wherein the sidewall of the first isolation region partially interfaces with the first one of the laterally opposed body sidewalls for at least 2 nm and the sidewall of the second isolation region partially interfaces with the second one of the laterally opposed body sidewalls for at least 2 nm.

11. A computing device, comprising:
a board; and
a component coupled to the board, the component including an integrated circuit structure, comprising:
a body of semiconductor material, the body having a bottommost surface;
a gate structure in contact with and completely surrounding a portion of the body, the gate structure defining a channel region in the body;
a source region in contact with the body;
a drain region in contact with the body such that the portion of the body in contact with the gate structure is between the source region and the drain region;
a first isolation region under an entirety of the source region and having a top surface in contact with an entirety of a bottom surface of the source region laterally adjacent to the channel region, the first isolation region having an uppermost surface above or at a same level as the bottommost surface of the body, and the first isolation region having a bottommost surface below the bottommost surface of the body, wherein the body is not vertically intervening between the first isolation region and the source region; and a second isolation region under an entirety of the drain region and having a top surface in contact with an entirety of a bottom surface of the drain region laterally adjacent to the channel region, the second isolation region having an uppermost surface above or at a same level as the bottommost surface of the body, and the second isolation region having a bottommost surface below the bottommost surface of the body, wherein the body is not vertically intervening between the second isolation region and the drain region.

12. The computing device of claim 11, wherein the first isolation region has the uppermost surface above the bottommost surface of the body, and wherein the second isolation region has the uppermost surface above the bottommost surface of the body.

13. The computing device of claim 11, wherein the first isolation region has the uppermost surface at the same level as the bottommost surface of the body, and wherein the second isolation region has the uppermost surface at the same level as the bottommost surface of the body.

14. The computing device of claim 11, further comprising:
a memory coupled to the board.

15. The computing device of claim 11, further comprising:
a communication chip coupled to the board.

16. The computing device of claim 11, further comprising:
a battery coupled to the board.

17. The computing device of claim 11, further comprising:
a camera coupled to the board.

18. The computing device of claim 11, further comprising:
a display coupled to the board.

19. The computing device of claim 11, wherein the component is a packaged integrated circuit die.

20. The computing device of claim 11, wherein the component is selected from the group consisting of a processor, a communications chip, and a digital signal processor.

* * * * *